(12) United States Patent
Yeh et al.

(10) Patent No.: US 9,755,007 B2
(45) Date of Patent: Sep. 5, 2017

(54) PIXEL CIRCUIT

(71) Applicant: AU Optronics Corporation, Hsin-Chu (TW)

(72) Inventors: Chi-Yu Yeh, Hsin-Chu (TW); Chen-Ming Hu, Hsin-Chu (TW); Yen-Shih Huang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/181,777

(22) Filed: Jun. 14, 2016

(65) Prior Publication Data

US 2017/0133447 A1 May 11, 2017

(30) Foreign Application Priority Data

Nov. 11, 2015 (TW) .............................. 104137211 A

(51) Int. Cl.
| | | |
|---|---|---|
| *H01L 27/32* | (2006.01) | |
| *H01L 29/786* | (2006.01) | |
| *G09G 3/3225* | (2016.01) | |

(52) U.S. Cl.
CPC ....... *H01L 27/3262* (2013.01); *G09G 3/3225* (2013.01); *H01L 27/3265* (2013.01); *H01L 27/3276* (2013.01); *H01L 29/78696* (2013.01); *G09G 2300/0819* (2013.01); *G09G 2320/0233* (2013.01)

(58) Field of Classification Search
CPC . H01L 27/32; H01L 27/3262; H01L 27/3276; H01L 27/3265
See application file for complete search history.

(56) References Cited

U.S. PATENT DOCUMENTS

| | | | |
|---|---|---|---|
| 6,169,313 B1 * | 1/2001 | Tsutsumi | ................ H01L 27/11 257/390 |
| 6,888,182 B2 | 5/2005 | Mitani et al. | |
| 7,531,837 B2 | 5/2009 | Liu | |
| 9,018,707 B2 * | 4/2015 | Koo | ...................... H01L 27/088 257/368 |
| 9,461,048 B2 * | 10/2016 | Yen | ...................... H01L 23/5228 |
| 9,647,085 B2 * | 5/2017 | Huang | .............. H01L 29/66477 |
| 2015/0097762 A1 | 4/2015 | Kim | |

\* cited by examiner

*Primary Examiner* — Phuc Dang
(74) *Attorney, Agent, or Firm* — WPAT, PC

(57) ABSTRACT

A pixel circuit is provided comprising the following. The first transistor includes a gate electrode and a semiconductor layer comprising a channel region, a source region, a first drain region, and a second drain region. A first portion of the channel region is connected to the source region, a second portion of the channel region is connected to the first drain region, and a third portion of the channel region is connected to the second drain region. The channel width of the second portion is greater than that of the third portion. A capacitive device is connected to the gate of the first transistor. The second transistor includes a source region connected to the second drain region and a drain region connected to the light-emitting element. The third transistor includes a source region connected to the first drain region and a drain region connected to a capacitive device.

17 Claims, 18 Drawing Sheets

PIXEL CIRCUIT

TECHNICAL FIELD

The present disclosure relates to a pixel circuit.

BACKGROUND

Recently, Organic Light-Emitting Diodes (OLEDs) have become important light-emitting elements in flat display devices, because of the advantages such as instantaenous light emission, high contrast, wide color gamut, low power consumption, easy implementation of flexible displays, etc.

In a plurality of pixel circuits of an OLED display panel, each pixel includes a driving transistor therein, wherein a threshold voltage of the driving transistor often has an effect on a current flowing through the OLEDs. Due to difficulties in the manufacturing process, it is impossible for each driving transistor to have exactly identical performance parameters, and this effect of the threshold voltage on the current causes the display panel to have the problem of uneven brightness.

SUMMARY

In the plurality of embodiments of the present disclosure, by designing a feedback circuit to eliminate the effect of a threshold voltage on a current, and designing a single transistor (e.g., a first transistor M1) to have a channel region CH1 with two different channel widths. A feedback current passes through one of the channel regions of the transistor that has the wider width, so as to increase the feedback current to facilitate quick charging, thereby overcoming the problems for the feedback circuit which are derived from an unsaturated capacitance value of a capacitive device. Additionally, a driving current is designed to pass through one of the channel regions of the transistor that has the narrower width, thereby preventing uneven brightness of a display from being worsened due to shifting of a current.

Various embodiments of the present disclosure provide a pixel circuit, comprising a first transistor, a capacitive device, a light-emitting element, a second transistor, and a third transistor. The first transistor comprises a semiconductor layer, a gate, and an insulation layer. The semiconductor layer comprises a channel region, a source region, a first drain region, and a second drain region. A first portion of the channel region is connected to the source region, a second portion of the channel region is connected to the first drain region, and a third portion of the channel region is connected to the second drain region. The channel width of the second portion is greater than that of the third portion, and the source region is electrically connected to a voltage supply end. The gate electrode partially overlaps with the channel region.

The insulation layer is disposed between the gate electrode and the channel region. The capacitive device has a first end and a second end, and the first end of the capacitive device is electrically connected to the gate electrode of the first transistor. The second end of the capacitive device is electrically connected to a potential source. The second transistor comprises a semiconductor layer, a gate electrode, and an insulation layer. The semiconductor layer of the second transistor comprises a channel region, a source region, and a drain region, the channel region is connected between the source region and the drain region, the source region is directly connected to the second drain region of the first transistor, and the drain region is electrically connected to the light-emitting element. The channel width of the channel region of the semiconductor layer in the second transistor is less than that of the second portion of the channel region of the semiconductor layer in the first transistor. The gate electrode of the second transistor partially overlaps with the channel region. The insulation layer of the second transistor is disposed between the gate electrode and the channel region.

The third transistor comprises a semiconductor layer, a gate electrode, and an insulation layer. The semiconductor layer of the third transistor comprises a channel region, a source region, and a drain region, the channel region is connected between the source region and the drain region, the source region is directly connected to the first drain region of the first transistor, and the drain region is electrically connected to the first end of the capacitive device. The channel width of the channel region of the semiconductor layer in the third transistor is less than that of the second portion of the channel region of the semiconductor layer in the first transistor. The gate electrode of the third transistor partially overlaps with the channel region. The insulation layer of the third transistor is disposed between the gate electrode and the channel region.

In one or more embodiments of the present disclosure, the pixel circuit further comprises a fourth transistor, a fifth transistor, and a sixth transistor. The fourth transistor comprises a semiconductor layer, a gate electrode, and an insulation layer. The semiconductor layer comprises a channel region, a source region, and a drain region, wherein the channel region is connected between the source region and the drain region, the source region is directly connected to an initial voltage end, the drain region is directly connected to the first end of the capacitive device, and the channel width of the channel region of the semiconductor layer in the fourth transistor is less than that of the second portion of the channel region of the semiconductor layer in the first transistor. The gate electrode partially overlaps with the channel region. The insulation layer is disposed between the gate electrode and the channel region. The fifth transistor comprises a semiconductor layer, a gate electrode, and an insulation layer. The semiconductor layer comprises a channel region, a source region, and a drain region, wherein the channel region is connected between the source region and the drain region, the source region is directly connected to the voltage supply end, the drain region is directly connected to the source region of the first transistor, wherein the potential source to which the second end of the capacitive device is electrically connected is the voltage supply end, and the channel width of the channel region of the semiconductor layer in the fifth transistor is less than that of the second portion of the channel region of the semiconductor layer in the first transistor.

Furthermore, the gate electrode partially overlaps with the channel region. The insulation layer is disposed between the gate electrode and the channel region. The sixth transistor comprises a semiconductor layer, a gate electrode, and an insulation layer. The semiconductor layer comprises a channel region, a source region, and a drain region, wherein the channel region is connected between the source region and the drain region, the source region is directly connected to a data input end, the drain region is directly connected to the source region of the first transistor, and the channel width of the channel region of the semiconductor layer in the sixth transistor is less than that of the second portion of the channel region of the semiconductor layer in the first transistor. The gate electrode partially overlaps with the channel region. The insulation layer is disposed between the gate electrode and the channel region.

In one or more embodiments of the present disclosure, the pixel circuit further comprises a fourth transistor. The fourth transistor comprises a semiconductor layer, a gate electrode, and an insulation layer. The semiconductor layer comprises a channel region, a source region, and a drain region, wherein the channel region is connected between the source region and the drain region, the source region is directly connected to the drain region of the third transistor, the drain region is directly connected to the first end of the capacitive device, and the channel width of the channel region of the semiconductor layer in the fourth transistor is less than that of the second portion of the channel region of the semiconductor layer in the first transistor. The gate electrode partially overlaps with the channel region. The insulation layer is disposed between the gate electrode and the channel region.

In one or more embodiments of the present disclosure, the pixel circuit further comprises a fifth transistor, a sixth transistor, and a seventh transistor. The fifth transistor comprises a semiconductor layer, a gate electrode, and an insulation layer. The semiconductor layer comprises a channel region, a source region, and a drain region, wherein the channel region is connected between the source region and the drain region, the source region is directly connected to a initial voltage end, the drain region is directly connected to the drain region of the third transistor, and the channel width of the channel region of the semiconductor layer in the fifth transistor is less than that of the second portion of the channel region of the semiconductor layer in the first transistor. The gate electrode partially overlaps with the channel region. The insulation layer is disposed between the gate electrode and the channel region. The sixth transistor comprises a semiconductor layer, a gate electrode, and an insulation layer. The semiconductor layer comprises a channel region, a source region, and a drain region, wherein the channel region is connected between the source region and the drain region, the source region is directly connected to a data input end, the drain region is directly connected to the second end of the capacitive device, and the channel width of the channel region of the semiconductor layer in the sixth transistor is less than that of the second portion of the channel region of the semiconductor layer in the first transistor. The gate electrode partially overlaps with the channel region. The insulation layer is disposed between the gate electrode and the channel region. The seventh transistor comprises a semiconductor layer, a gate electrode, and an insulation layer. The semiconductor layer comprises a channel region, a source region, and a drain region, wherein the channel region is connected between the source region and the drain region, the source region is directly connected to the initial voltage end, the drain region is directly connected to the second end of the capacitive device, wherein the potential source to which the second end of the capacitive device is electrically connected is the data input end or the initial voltage end, and the channel width of the channel region of the semiconductor layer in the seventh transistor is less than that of the second portion of the channel region of the semiconductor layer in the first transistor; The gate electrode partially overlaps with the channel region. The insulation layer is disposed between the gate electrode and the channel region.

Various embodiments of the present disclosure provide a pixel circuit, comprising a first transistor, a second transistor, a third transistor, a capacitive device, and a light-emitting element. The first transistor has a gate electrode, a first channel region, a second channel region, a source region, a first drain region, and a second drain region, wherein one end of the first channel region and one end of the second channel region are both connected to the source region, the other end of the first channel region is connected to the first drain region, the other end of the second channel region is connected to the second drain region, the channel width of the first channel region is greater than that of the second channel region, the gate electrode overlaps with the first channel region and the second channel region, and the source region is electrically connected to a first voltage supply end. The second transistor has a gate electrode, a channel region, a source region, and a drain region, wherein the channel region is connected between the source region and the drain region, the source region is directly connected to the second drain region of the first transistor, the channel width of the channel region in the second transistor is less than that of the first channel region in the first transistor, and the gate electrode overlaps with the channel region. The third transistor has a gate electrode, a channel region, a source region, and a drain region, wherein the channel region is connected between the source region and the drain region, the source region is directly connected to the first drain region of the first transistor, the channel width of the channel region in the third transistor is less than that of the first channel region in the first transistor, and the gate electrode overlaps with the channel region. The capacitive device has a first end and a second end, the first end of the capacitive device is electrically connected to the gate electrode of the first transistor and the drain region in the third transistor, and the second end of the capacitive device is electrically connected to a potential source. The light-emitting element has a first end and a second end, the first end of the light-emitting element is electrically connected to the drain region of the second transistor, and the second end of the light-emitting element is electrically connected to a second voltage supply end.

In one or more embodiments of the present disclosure, the pixel circuit further comprises a fourth transistor, a fifth transistor, and a sixth transistor. The fourth transistor comprises a semiconductor layer, a gate electrode, and an insulation layer. The semiconductor layer comprises a channel region, a source region, and a drain region, wherein the channel region is connected between the source region and the drain region, the source region is directly connected to an initial voltage end, the drain region is directly connected to the first end of the capacitive device, and the channel width of the channel region in the fourth transistor is less than that of the first channel region in the first transistor. The gate electrode partially overlaps with the channel region. The insulation layer is disposed between the gate electrode and the channel region. The fifth transistor comprises a semiconductor layer, a gate electrode, and an insulation layer. The semiconductor layer comprises a channel region, a source region, and a drain region, wherein the channel region is connected between the source region and the drain region, the source region is directly connected to the first voltage supply end, the drain region is directly connected to the source region of the first transistor, and the channel width of the channel region in the fifth transistor is less than that of the first channel region in the first transistor. The gate electrode partially overlaps with the channel region. The insulation layer is disposed between the gate electrode and the channel region. The sixth transistor comprises a semiconductor layer, a gate electrode, and an insulation layer. The semiconductor layer comprises a channel region, a source region, and a drain region, wherein the channel region is connected between the source region and the drain region, the source region is directly connected to a data input end, the drain region is directly connected to the source region of the first transistor, and the channel width of the channel region in the sixth transistor is less than that of the first channel region in the first transistor. The gate electrode partially overlaps with the channel region. The insulation layer is disposed between the gate electrode and the channel region.

In one or more embodiments of the present disclosure, the pixel circuit further comprises a fourth transistor. The fourth transistor comprises a semiconductor layer, a gate electrode, and an insulation layer. The semiconductor layer comprises a channel region, a source region, and a drain region, wherein the channel region is connected between the source region and the drain region, the source region is directly connected to the drain region of the third transistor, the drain region is directly connected to the gate electrode of the first transistor, and the channel width of the channel region in the fourth transistor is less than that of the first channel region in the first transistor. The gate electrode partially overlaps with the channel region. The insulation layer is disposed between the gate electrode and the channel region.

In one or more embodiments of the present disclosure, the pixel circuit further comprises a fifth transistor, a sixth transistor, and a seventh transistor. The fifth transistor comprises a semiconductor layer, a gate electrode, and an insulation layer. The semiconductor layer comprises a channel region, a source region, and a drain region, wherein the channel region is connected between the source region and the drain region, the source region is directly connected to an initial voltage end, the drain region is directly connected to the drain region of the third transistor, and the channel width of the channel region in the fifth transistor is less than that of the first channel region in the first transistor. The gate electrode partially overlaps with the channel region. The insulation layer is disposed between the gate electrode and the channel region. The sixth transistor comprises a semiconductor layer, a gate electrode, and an insulation layer. The semiconductor layer comprises a channel region, a source region, and a drain region, wherein the channel region is connected between the source region and the drain region, the source region is directly connected to a data input end, the drain region is directly connected to the second end of the capacitive device, and the channel width of the channel region in the sixth transistor is less than that of the first channel region in the first transistor. The gate electrode partially overlaps with the channel region. The insulation layer is disposed between the gate electrode and the channel region. The seventh transistor comprises a semiconductor layer, a gate electrode, and an insulation layer. The semiconductor layer comprises a channel region, a source region, and a drain region, wherein the channel region is connected between the source region and the drain region, the source region is directly connected to an initial voltage end, the drain region is directly connected to the second end of the capacitive device, and the channel width of the channel region in the seventh transistor is less than that of the first channel region in the first transistor. The gate electrode partially overlaps with the channel region. The insulation layer is disposed between the gate electrode and the channel region.

BRIEF DESCRIPTION OF THE DRAWINGS

FIG. 1F and FIG. 1G are schematic views of operation of the pixel circuit in

FIG. 1A in various time periods.

FIG. 5D to FIG. 5F are schematic views of operation of the pixel circuit in

FIG. 5A in various time periods.

FIG. 6E to FIG. 6G are schematic views of operation of the pixel circuit in

FIG. 6A in various time periods.

DETAILED DESCRIPTION

Figure 1A:
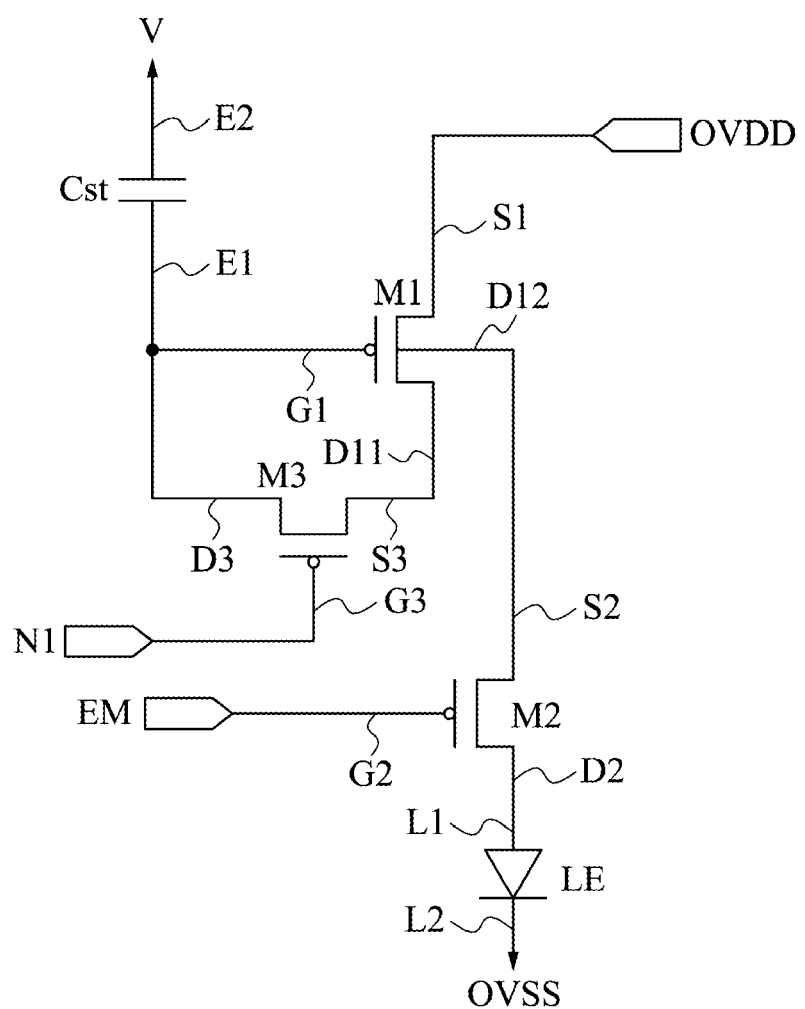
FIG. 1A is an equivalent circuit diagram of a pixel circuit according to a first embodiment of the present disclosure.

Drawings will be used below to disclose a plurality of embodiments of the present disclosure. For the sake of clear illustration, many practical details will be explained together in the description below. However, it is appreciated that the practical details should not be used to limit the present disclosure. In other words, in some embodiments of the present disclosure, the practical details are not essential. Moreover, for the sake of drawing simplification, some conventionally customary structures and elements in the drawings will be schematically shown in a simplified way.

Figure 1B:
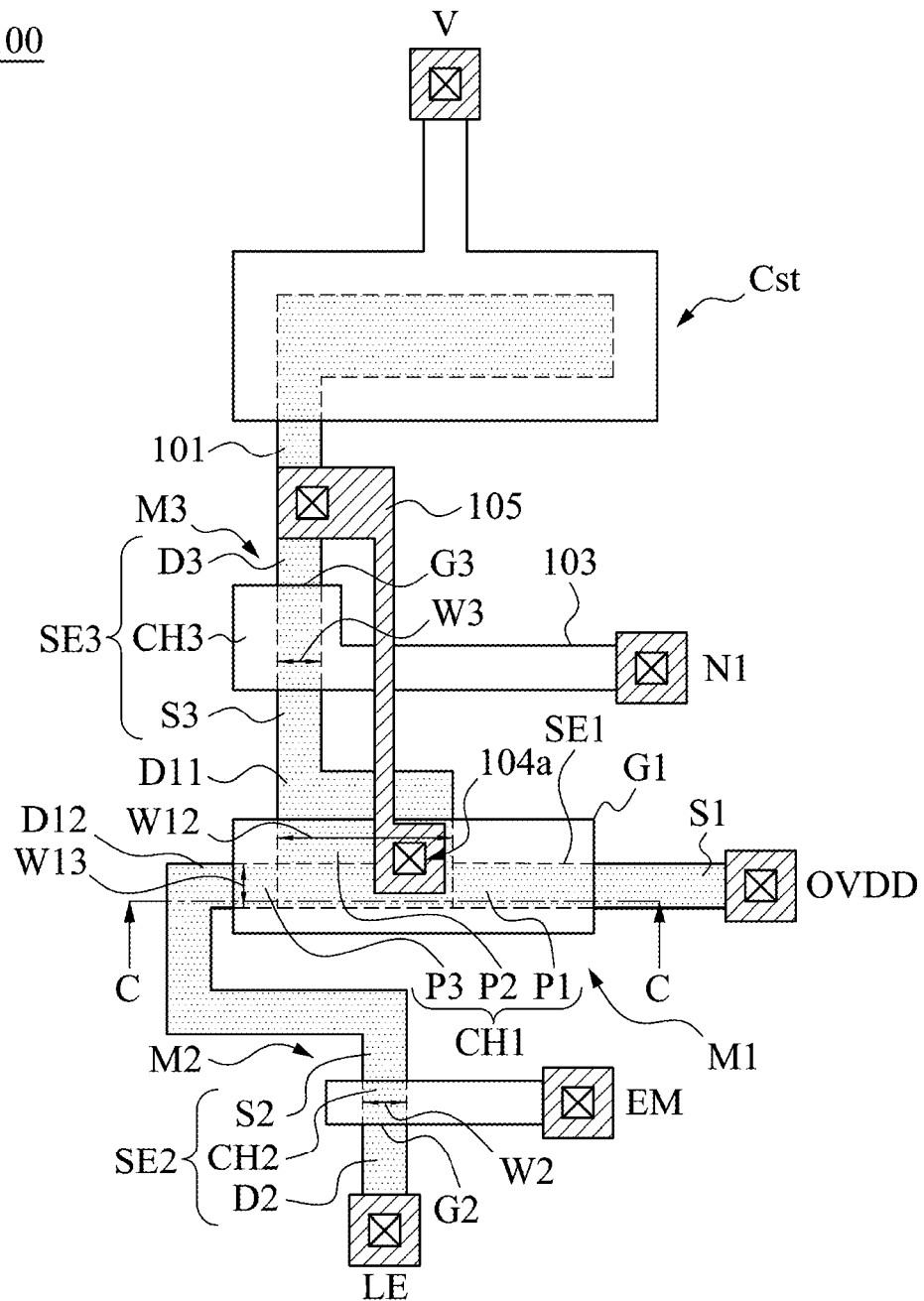
FIG. 1B is a schematic top view of the pixel circuit in FIG. 1A.
Figure 1C:
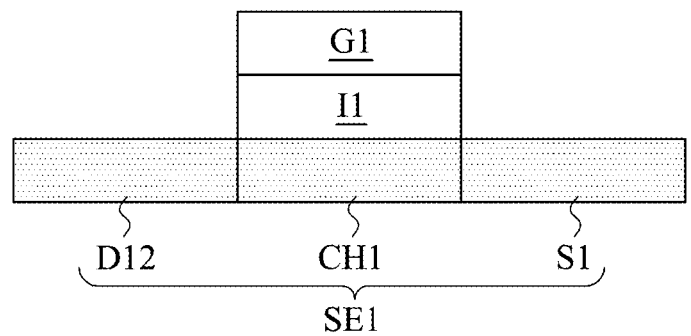
FIG. 1C is a partial cross-sectional schematic view along a line C-C in FIG. 1B.

Referring to FIG. 1A to FIG. 1C, FIG. 1A is an equivalent circuit diagram of a pixel circuit 100 according to a first embodiment of the present disclosure, FIG. 1B is a schematic top view of the pixel circuit 100 in FIG. 1A, and FIG. 1C is a partial cross-sectional schematic view along a line C-C in FIG. 1B. The pixel circuit 100 of the present embodiment is exemplified by application in an organic electroluminescent display as an example, but in actual application, the scope of the present disclosure is not limited thereto. It will be appreciated that this pixel circuit 100 may be used in other types of displays, for example, liquid crystal displays, electrophoretic displays, etc.

The present embodiment provides a pixel circuit 100 comprising a first transistor M1, a capacitive device (or namely capacitor) Cst, a light-emitting element LE, a second transistor M2, and a third transistor M3, wherein some of the above-described elements may be formed by disposing a plurality of layers on a substrate. The pixel circuit 100 of the present embodiment is illustrated with an architecture of three transistors and one capacitive device (3T1C) as an example, wherein the first transistor M1 serves as a driving transistor, the second transistor M2 serves as a switching transistor, and the third transistor M3 serves as a compensation transistor. However, the present disclosure is not limited thereto. In other embodiments, the pixel circuit 100 may have an architecture of more than three transistors, for example, 4T2C, 5T1C, 6T1C, 7T1C, or other architectures.

For detailed illustration of the present embodiment, FIG. 1C shows a cross-section of the first transistor M1 of the pixel circuit 100, and those skilled in the art can understand a cross-sectional structure of other transistors from the first transistor M1 in FIG. 1C.

Reference is made to FIG. 1A, FIG. 1B, and FIG. 1C together. The first transistor M1 comprises a semiconductor layer SE1, a gate electrode G1, and an insulation layer I1. The semiconductor layer SE1 comprises a channel region CH1, a source region S1, a first drain region D11, and a second drain region D12. A first portion P1 of the channel region CH1 is connected to the source region 51, a second portion P2 of the channel region CH1 is connected to the first drain region D11, and a third portion P3 of the channel region CH1 is connected to the second drain region D12. Herein, the channel width W12 of the second portion P2 is greater than the channel width W13 of the third portion P3, and the source region S1 is electrically connected to a voltage supply end OVDD. In other words, the channel region CH1 of the single first transistor M1 has two different channel widths. The gate electrode G1 partially overlaps with the channel region CH1. The insulation layer I1 is disposed between the gate electrode G1 and the channel region CH1. The capacitive device Cst has a first end E1 and a second end E2, and the first end E1 of the capacitive device Cst is electrically connected to the gate electrode G1 of the first transistor M1. The second end E2 of the capacitive device Cst is electrically connected to a potential source V.

The second transistor M2 comprises a semiconductor layer SE2, a gate electrode G2, and an insulation layer (analogous to the insulation layer I1 in the FIG. 1C). The semiconductor layer SE2 of the second transistor M2 comprises a channel region CH2, a source region S2, and a drain region D2. The channel region CH2 is connected between the source region S2 and the drain region D2, the source region S2 is directly connected to the second drain region D12 of the first transistor M1, and the drain region D2 is electrically connected to the light-emitting element LE. The channel width W2 of the channel region CH2 of the semiconductor layer SE2 in the second transistor M2 is less than the channel width W12 of the second portion P2 of the channel region CH1 of the semiconductor layer SE1 in the first transistor M1. The gate electrode G2 of the second transistor M2 partially overlaps with the channel region CH2. The insulation layer (analogous to the insulation layer I1 in the FIG. 1C) of the second transistor M2 is disposed between the gate electrode G2 and the channel region CH2.

The third transistor M3 comprises a semiconductor layer SE3, a gate electrode G3, and an insulation layer (analogous to the insulation layer I1 in the FIG. 1C). The semiconductor layer SE3 of the third transistor M3 comprises a channel region CH3, a source region S3, and a drain region D3. The channel region CH3 is connected between the source region S3 and the drain region D3, the source region S3 is directly connected to the first drain region D11 of the first transistor M1, and the drain region D3 is electrically connected to the first end E1 of the capacitive device Cst. The channel width W3 of the channel region CH3 of the semiconductor layer SE3 in the third transistor M3 is less than the channel width W12 of the second portion P2 of the channel region CH1 of the semiconductor layer SE1 in the first transistor M1. The gate electrode of the third transistor M3 partially overlaps with the channel region CH3. The insulation layer (analogous to the insulation layer I1 in the FIG. 1C) of the third transistor M3 is disposed between the gate electrode and the channel region CH3.

Herein, the insulation layers of the second transistor M2 and the third transistor M3 cannot be observed in FIG. 1B for being covered by the gate electrode G2 and the gate electrode G3, respectively, and those skilled in the art can understand the structures of the second transistor M2 and the third transistor M3 from the structure of the first transistor M1 in FIG. 1C.

Figure 1D:
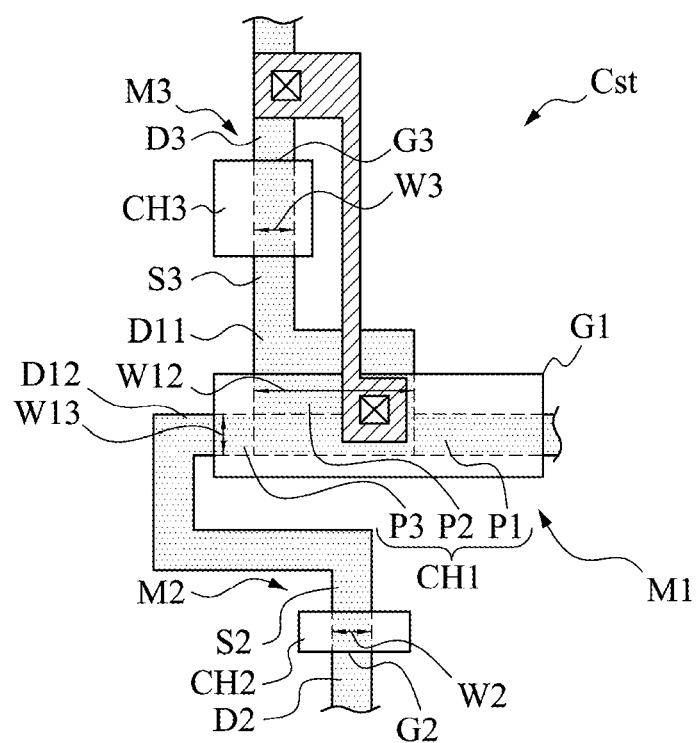
FIG. 1D is a partial schematic top view of the pixel circuit in FIG. 1B.

FIG. 1D is a partial schematic top view of the pixel circuit 100 in FIG. 1B. Reference is made to FIG. 1B and FIG. 1D together. In the present embodiment, the channel width W12 of the second portion P2 is configured to be greater than the channel width W13 of the third portion P3. For example, the channel width W12 of the second portion P2 is substantially four times the channel width W13 of the third portion P3. This configuration may enable the second portion P2 of the first transistor M1 to allow the flow of a larger current compared to the third portion P3 of the first transistor M1. In other words, the channel region CH1 of the single first transistor M1 has two different channel widths, and thus a current flowing from the first transistor M1 through the third transistor M3 is greater than a current flowing from the first transistor M1 through the second transistor M2. In the present embodiment, the third transistor M3 is designed to charge the capacitive device Cst with a larger current, to feedback a voltage at the gate electrode G1 controlling the first transistor M1.

It will be appreciated that the direction of each channel width denoted in the present embodiment intersects the flow direction of a current passing through the channel portion. For example, the direction of the channel width W12 of the second portion P2 intersects the flow direction of a current passing through the second portion P2, and the direction of the channel width W13 of the third portion P3 intersects the flow direction of a drain current passing through the third portion P3. Although the channel width W13 of the third portion P3, the channel width W2 of the channel region CH2, and the channel width W3 of the channel region CH3 are configured to be substantially the same in the figures, the scope of the present disclosure is not limited thereto. In actual configurations, the channel width W13, the channel width W2, and the channel width W3 are not necessarily substantially the same, and the channel width W3 of the third transistor M3 may be configured to be greater than the channel width W2 of the second transistor M2 to increase a compensation current.

In the present embodiment, the first drain region D11 and the second drain region D12 are configured to be located above and on the left of the channel region CH1, respectively, such that the flow direction of the current passing through the second portion P2 and the flow direction of the current passing through the third portion P3 are substantially perpendicular to each other. In other embodiments, the flow directions of the currents may be configured to be in other relationships, and the scope of the present disclosure is not limited to those depicted in the figures.

Refer back to FIG. 1B. In the present embodiment, in a layer structure, the pixel circuit 100 may comprise a semiconductor layer 101 (a block filled with dots), a first insulation layer, a first conductive layer 103 (a blank block), a second insulation layer, and a second conductive layer 105 (a block filled with oblique lines), that are stacked in order.

The semiconductor layer 101 may be patterned, doped with ions, and subjected to other steps, to form the semiconductor layer SE1 of the first transistor M1, the semiconductor layer SE2 of the second transistor M2, and the semiconductor layer SE3 of the third transistor M3. A material of the semiconductor layer 101 may be a semiconductor (for example, monocrystalline silicon, polycrystalline silicon, or other suitable materials) or an oxide semiconductor (for example, indium gallium oxide, titanium oxide, or indium tin oxide).

The first insulation layer is patterned to form the insulation layer I1 of the first transistor M1, the insulation layer (analogous to the insulation layer I1 in the FIG. 1C) of the second transistor M2, and the insulation layer (analogous to the insulation layer I1 in the FIG. 1C) of the third transistor M3. The first insulation layer covers the semiconductor layer 101. A material of the first insulation layer may be selected from various organic insulation materials or inorganic insulation materials.

The first conductive layer 103 is patterned to form the gate electrode G1 of the first transistor M1, the gate electrode G2 of the second transistor M2, and the gate electrode G3 of the third transistor M3. A material of the first conductive layer 103 may be a metal or another conductive material.

The second insulation layer covers the semiconductor layer 101, the first insulation layer, and the first conductive layer 103. The first insulation layer and the second insulation layer may have a plurality of contact windows 104a to expose some predetermined connection areas, for example, the gate electrode G1, the source S1, the drain region D2, and the drain region D3. The second conductive layer 105 may be disposed on the second insulation layer, and in contact with the connection areas through the contact windows 104a, and then patterned to form predetermined electrical connections.

For example, the gate electrode G1 of the first transistor M1 may be electrically connected to the drain region D3 of the first transistor M1 via the patterned second conductive layer 105 and a contact window 104a. The source S1 of the first transistor M1 may be electrically connected to the voltage supply end OVDD via the patterned second conductive layer 105 and a contact window 104a.

The capacitive device Cst may comprise a plurality of layers (e.g., a dielectric layer) disposed at the semiconductor layer 101 and the first conductive layer 103 above and below it, to be electrically connected to other elements through the semiconductor layer 101 and the first conductive layer 103.

In the present embodiment, the gate electrode G2 of the second transistor M2 is electrically connected to a light-emitting signal (or light-emitting signal end) EM, and the gate electrode G3 of the third transistor M3 is electrically connected to a first scan signal (or first scan signal end) N1, thereby constituting the pixel circuit 100 of the substrate. In other words, the gate electrode G2 of the second transistor M2 is receiving a light-emitting signal EM, and the gate electrode G3 of the third transistor M3 is receiving the first scan signal N1.

Herein, the light-emitting element LE has a first end L1 electrically connected to the drain region D2 of the second transistor M2, and has a second end L2 electrically connected to a voltage supply end OVSS. A potential at the voltage supply end OVDD (e.g. about positive 4.6V) is greater than a potential at the voltage supply end OVSS (e.g. about negative 2.4V).

Figure 1E:
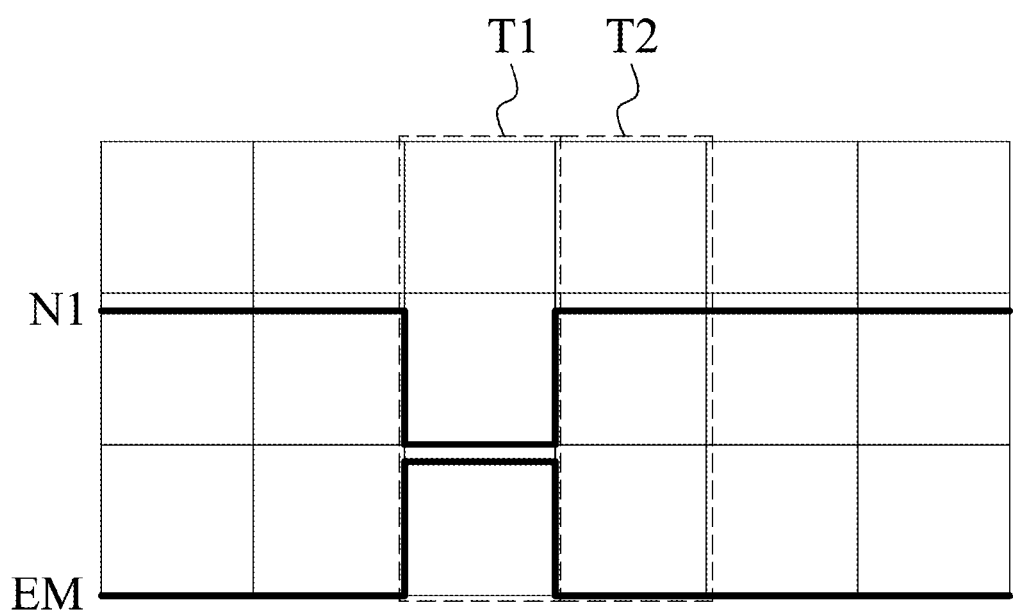
FIG. 1E is a schematic view of signals of the pixel circuit in FIG. 1A.
Figures 1F, 1G:
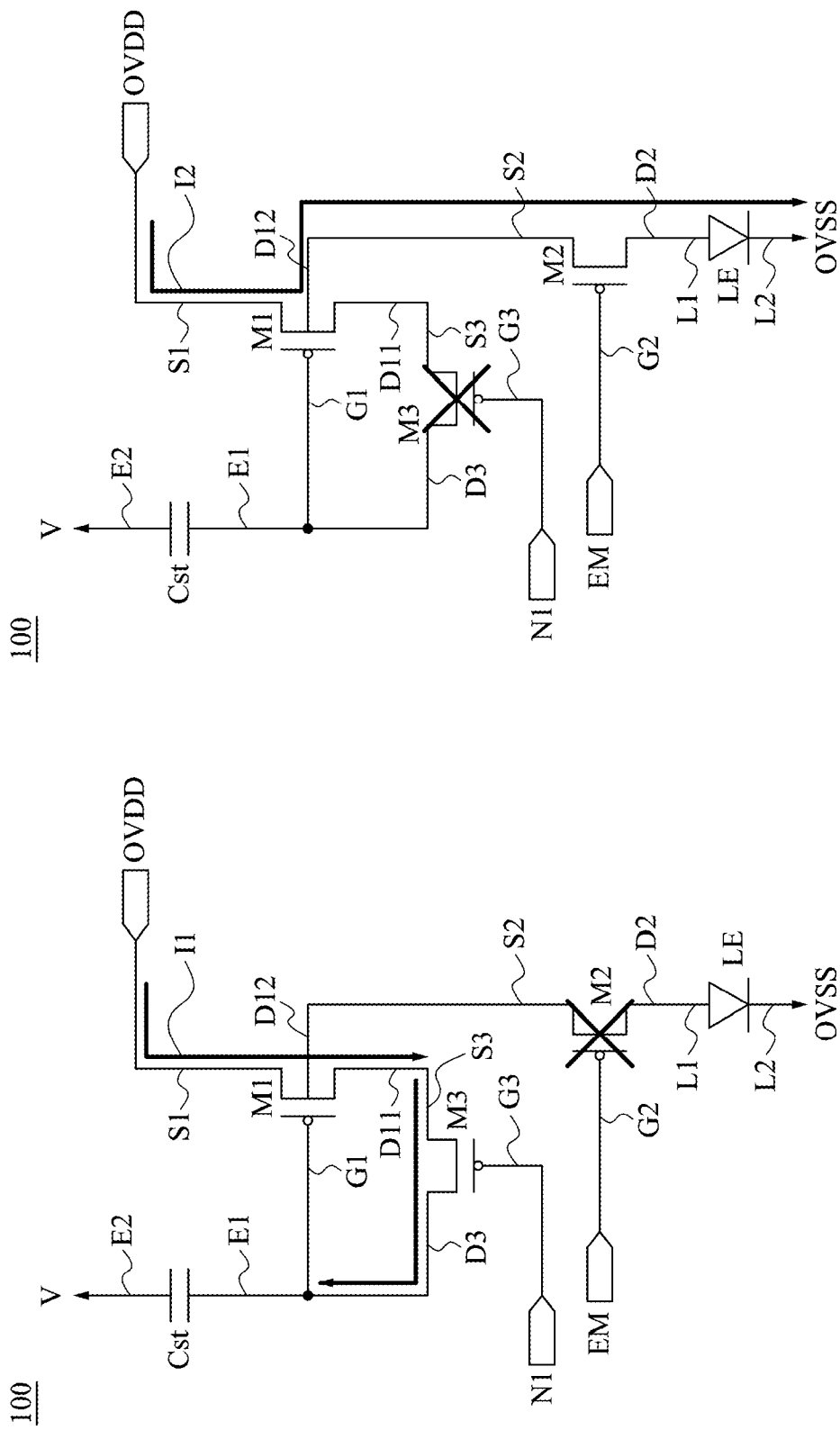

Reference is made to FIG. 1B, FIG. 1E, FIG. 1F, and FIG. 1G together. FIG. 1E is a schematic view of signals of the pixel circuit in FIG. 1A. FIG. 1F and FIG. 1G are schematic views of operation of the pixel circuit in FIG. 1A in various time periods. The potential source V may have different waveforms in various time periods respectively. For example, herein, the potential source V may be connected to a data input end Vdata in a first time period T1, and to an initial voltage end Vint in a second time period T2.

It will be appreciated that the amount of an ideal drain current meets the following equation:

$$I=(1/2)\times(\mu cW/L)\times(Vsg-|Vth\_M1|)^2 \quad \text{Equation (1)}.$$

wherein I is a drain current (unit: microampere, µA), µ is a carrier mobility (unit: m²/(speed*time), with the time unit: second and the speed unit: m/sec), W is the channel width (unit: micrometer, µm), c is a capacitance of the gate electrode oxide layer (unit: femtofarad, fF), L is a channel length (unit: micrometer, µm), Vsg is a potential difference between the source region S1 and the gate electrode G1 of the first transistor M1 (unit: Volt, V), and Vth_M1 is a threshold voltage of the first transistor M1 (unit: Volt, V).

In the first time period T1 (i.e., a data writing state), the second transistor M2 is turned off according to the light-emitting signal EM having a high voltage level. The third transistor M3 conducts the source region S3 and the drain region D3 of the third transistor M3 according to the first scan signal N1 having a low voltage level, such that the first drain region D11 of the first transistor M1 is electrically connected to the gate electrode G1 and the first end E1 of the capacitive device Cst. The current I1 may be provided by the voltage supply end OVDD via the first transistor M1, flow from the source region S1 of the first transistor M1 through the second portion P2 of the channel region CH1 toward the first drain region D11, and then through the third transistor M3 to charge the capacitive device Cst.

Since capacitor charging belongs to an analog circuit, the closer to saturation the capacitor is, the less easily the capacitor is further charged. In a limited pixel switching time, for example, 30 micro-seconds (µs), it is not easy to fully charge the capacitor. When the capacitor is under-compensated (not charged to saturation), it is possible that the potential at the gate electrode G1 of the first transistor M1 cannot be ideally maintained in the next stage (time period), so that the drain current is not stable, resulting in uneven brightness of a display.

Herein, by a proportional relationship between the magnitude of the drain current and the channel width (with reference to the Equation (1)) and by the design of the channel width W12 of the second portion P2 being greater than the channel width W13 of the third portion P3, the current I1 in the compensation stage may be raised, such that the compensation capability is increased, and the potential at the gate electrode G1 of the first transistor M1 can be quickly charged to fully reach a potential difference of the voltage supply end OVDD and an absolute value of the threshold voltage Vth_M1 of the first transistor M1 (e.g., OVDD-|Vth_M1|). As such, the subsequent problem of uneven brightness of the display due to under-compensation can be avoided.

Then, in the second time period T2 (i.e., a light-emitting state), the third transistor M3 is turned off according to the first scan signal N1 having a high voltage level (e.g., about positive 6V). The second transistor M2 conducts the light-emitting element LE and the second drain region D12 of the first transistor M1 according to the light-emitting signal EM having a low voltage level.

At this time, according to the potential Vg (e.g., about equal to OVDD−|Vth_M1|+Vint−Vdata, where the unit of all the operands is Volts, V) at the gate electrode G1 of the first transistor M1, the first transistor M1 enables a current I2 flowing from the source region S1 of the first transistor M1 through the third portion P3 of the channel region CH1 toward the second drain region D12 and then through the second transistor M2, to cause the light-emitting element LE to generate light rays (or namely to emit light). Herein, due to the proportional relationship between the magnitude of the drain current and the channel width (with reference to the Equation (1)), by designing the first transistor M1 as having a smaller channel width W13 (compared to the channel width W12), the current I2 can be maintained to be not excessively large, and when the capacitor is under-compensated, the amount of shifting of the current I2 can be reduced, thereby preventing uneven brightness of a display from being worsened due to shifting of the current I2.

Although in the first embodiment the channel region CH1 is depicted as approximately T-shaped, such that the first portion P1, the second portion P2, and the third portion P3 neighbor to the source region S1, the first drain region D11, and the second drain region D12 respectively are located at three ends of the channel region CH1. In other words, one ends of the first portion P1, the second portion P2, and the third portion P3 is connected to each other, and any other ends of the first portion P1, the second portion P2, and the third portion P3 is not connected to each other; the scope of the present disclosure is not limited thereto.

Figure 2:
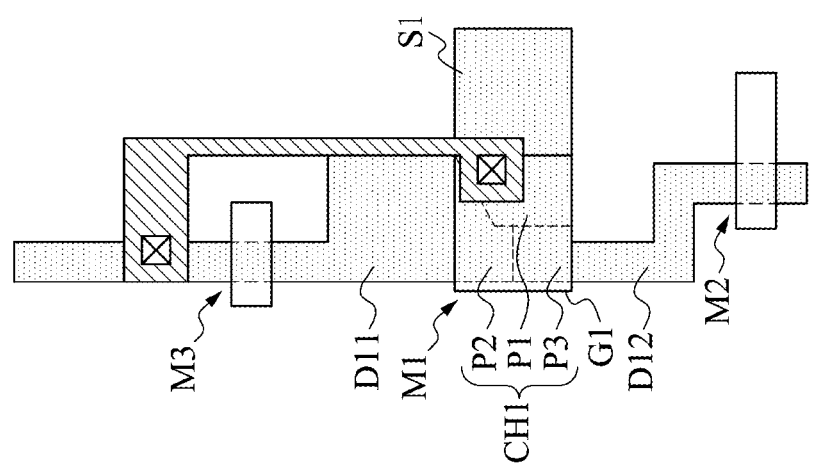
FIG. 2 is a partial schematic top view of a pixel circuit according to a second embodiment of the present disclosure.

FIG. 2 is a partial schematic top view of a pixel circuit according to a second embodiment of the present disclosure. The present embodiment is substantially similar to the first embodiment, with one of the differences in that the channel region CH1 is approximately rectangular (for example, the shape enclosed by the gate electrode G1) in the present embodiment. In particular, the channel region CH1 comprises the first portion P1, the second portion P2, and the third portion P3 so as to be neighbor to the source region S1, the first drain region D11, and the second drain region D12 respectively, wherein at least a part of the first portion P1 and at least a part of the third portion P3 are directly connected to each other, and at least a part of the second portion P2 and at least a part of the third portion P3 are directly connected to each other.

In addition, in the present embodiment, the first drain region D11 and the second drain region D12 are configured to be located at two opposite sides of the channel region CH1, respectively, such that the flow direction of the current passing through the second portion P2 and the flow direction of the current passing through the third portion P3 are opposite (or namely reverse) to each other. Other details of the present embodiment are generally as described above and are not repeatedly described herein.

Figure 3:
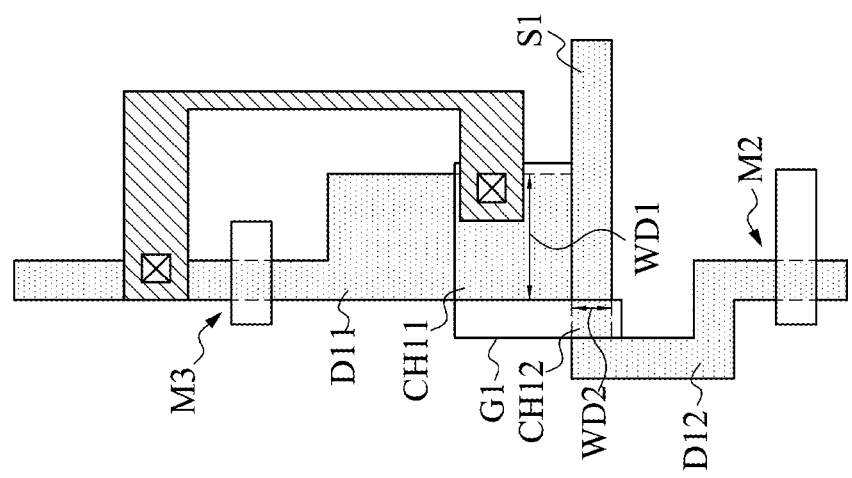
FIG. 3 is a partial schematic top view of a pixel circuit according to a third embodiment of the present disclosure.

FIG. 3 is a partial schematic top view of a pixel circuit according to a third embodiment of the present disclosure. The present embodiment is substantially similar to the first embodiment, with differences in that in the present embodiment, the first transistor M1 has a first channel region CH11 and a second channel region CH12, one end of the first channel region CH11 and one end of the second channel region CH12 are both connected to the source region S1, the other end of the first channel region CH11 is connected to a first drain region D11, the other end of the second channel region CH12 is connected to a second drain region D12, the channel width WD1 of the first channel region CH11 is greater than the channel width WD2 of the second channel region CH12, and the gate electrode G1 overlaps with the first channel region CH11 and the second channel region CH12.

In some embodiments, a portion of the first channel region CH11 may be configured to be connected to a portion of the second channel region CH12. Other details of the present embodiment are generally as described above and are not repeatedly described herein.

Figure 4:
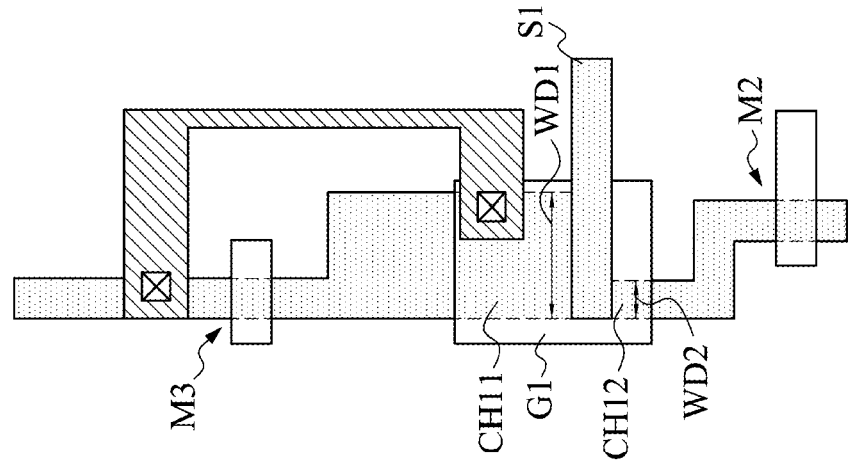
FIG. 4 is a partial schematic top view of a pixel circuit according to a fourth embodiment of the present disclosure.

FIG. 4 is a partial schematic top view of a pixel circuit according to a fourth embodiment of the present disclosure. The present embodiment is substantially similar to the third embodiment, in which the first channel region CH11 and the second channel region CH12 are configured to be not connected to each other, with a difference in that a flow direction of a current passing through the first channel region CH11 is opposite (or namely reverse) to a flow direction of a current passing through the second channel region CH12 in the present embodiment. In other words, in the present embodiment the first channel region CH11 and the second channel region CH12 are configured to be at two opposite sides of the source region S1. Other details of the present embodiment are generally as described above and are not repeatedly described herein.

Figure 5A:
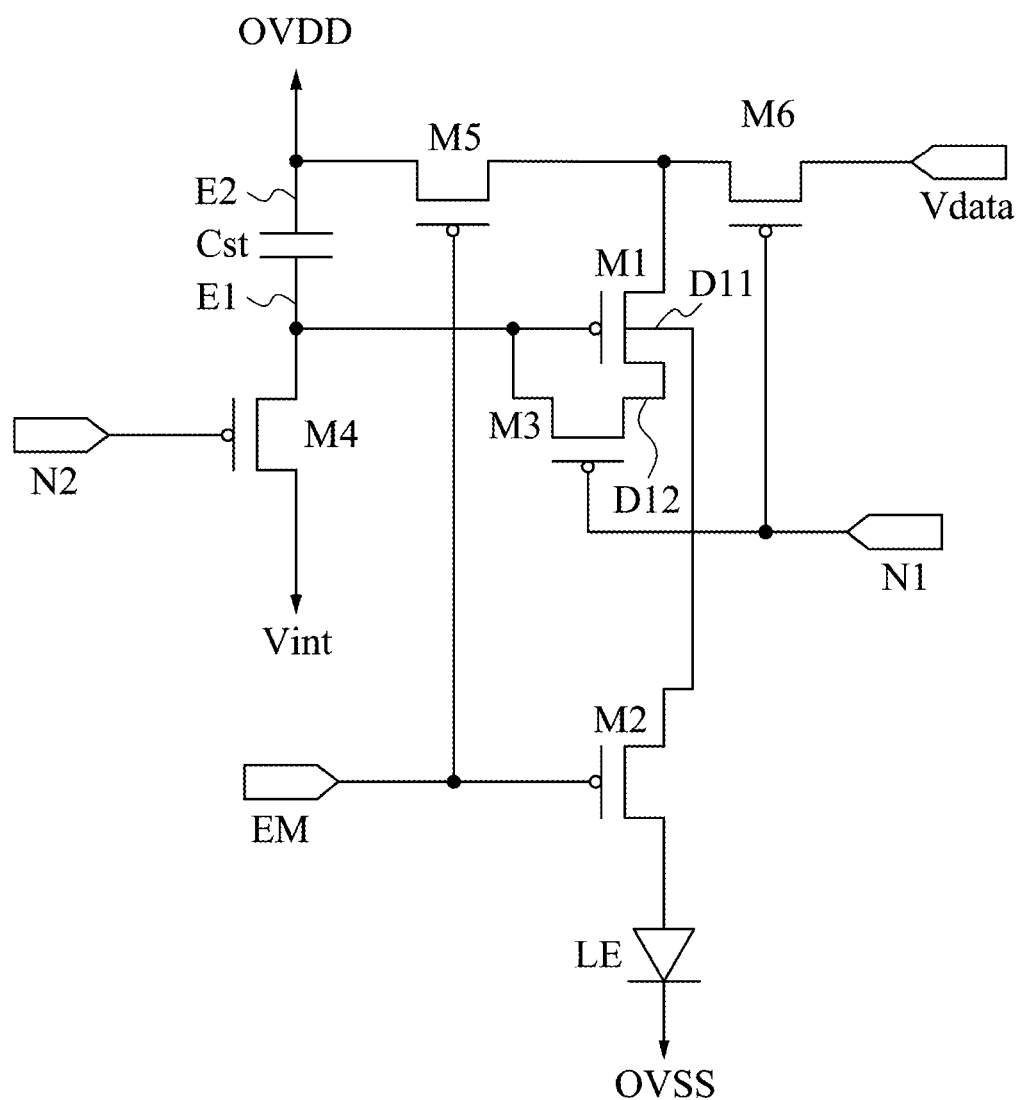
FIG. 5A is an equivalent circuit diagram of a pixel circuit according to a fifth embodiment of the present disclosure.
Figure 5B:
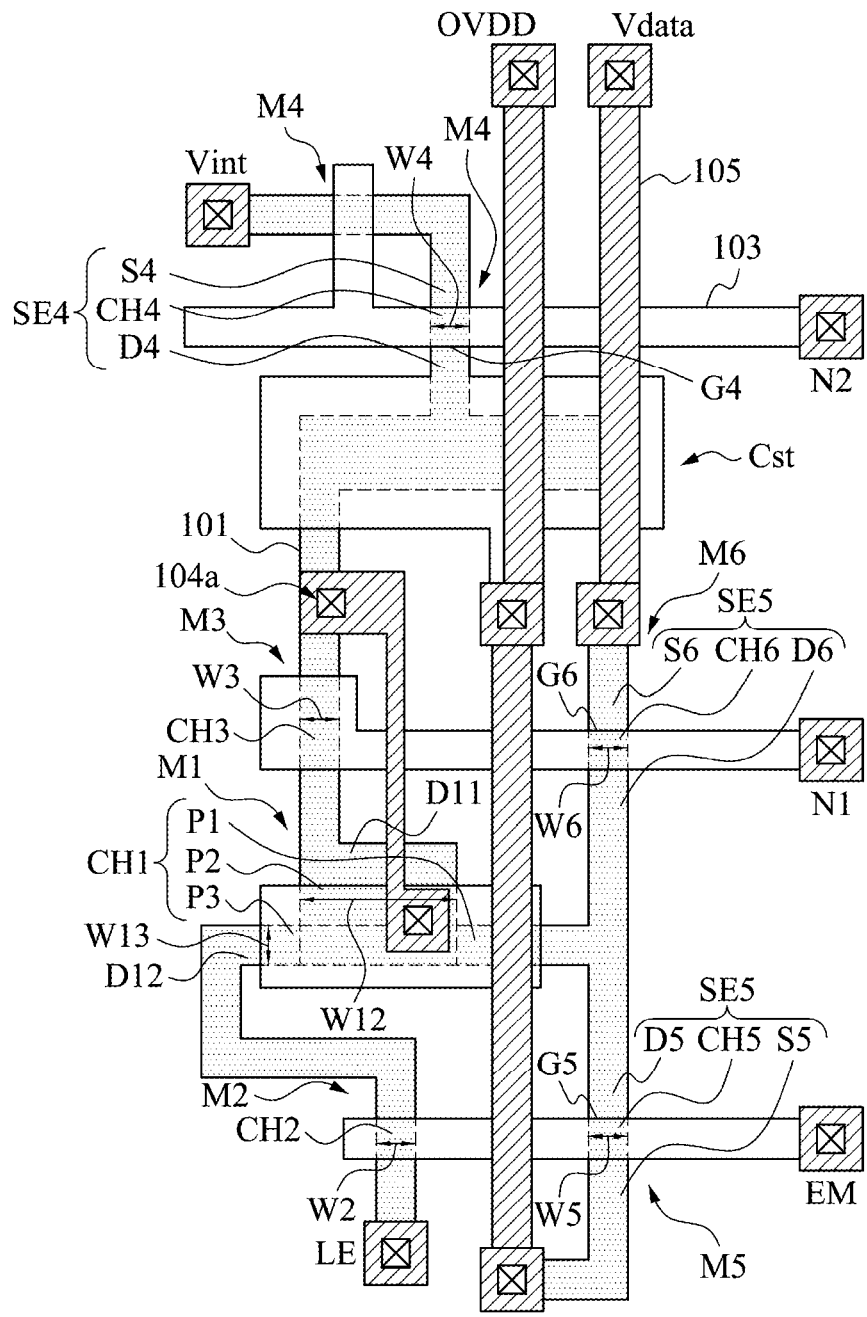
FIG. 5B is a schematic top view of the pixel circuit in FIG. 5A.

Reference is made to FIG. 5A and FIG. 5B together. FIG. 5A is an equivalent circuit diagram of a pixel circuit 200 according to a fifth embodiment of the present disclosure. FIG. 5B is a schematic top view of the pixel circuit 200 in FIG. 5A. The present embodiment is generally as described in the first embodiment, with a difference in that the pixel circuit 200 of the present embodiment has six transistors and one capacitive device, i.e., a 6T1C structure. Herein, the pixel circuit 200 comprises a first transistor M1, a capacitive device Cst, a light-emitting element LE, a second transistor M2, a third transistor M3, a fourth transistor M4, a fifth transistor M5, and a sixth transistor M6. The configurations of the first transistor M1, the capacitive device Cst, the light-emitting element LE, the second transistor M2, and the third transistor M3 are generally as described in the first embodiment, and are not repeatedly described herein.

The fourth transistor M4 comprises a semiconductor layer SE4, a gate electrode G4, and an insulation layer (analogous to the insulation layer I1 in the FIG. 1C). The semiconductor layer SE4 comprises a channel region CH4, a source region S4, and a drain region D4, wherein the channel region CH4 is connected between the source region S4 and the drain region D4, the source region S4 is directly connected to an initial voltage end Vint, the drain region D4 is directly connected to the first end E1 of the capacitive device Cst, and the channel width W4 of the channel region CH4 of the semiconductor layer SE4 in the fourth transistor M4 is less than the channel width W12 of the second portion P2 of the channel region CH1 of the semiconductor layer SE1 in the first transistor M1. The gate electrode G4 partially overlaps with the channel region CH4. The insulation layer (analogous to the insulation layer I1 in the FIG. 1C) is disposed between the gate electrode G4 and the channel region CH4.

The fifth transistor M5 comprises a semiconductor layer SE5, a gate electrode G5, and an insulation layer (analogous to the insulation layer I1 in the FIG. 1C). The semiconductor layer SE5 comprises a channel region CH5, a source region S5, and a drain region D5, wherein the channel region CH5 is connected between the source region S5 and the drain region D5, the source region S5 is directly connected to a voltage supply end OVDD, and the drain region D5 is directly connected to the source region S1 of the first transistor M1, wherein the potential source V to which the second end E2 of the capacitive device Cst is electrically connected is the voltage supply end OVDD, and the channel width W5 of the channel region CH5 of the semiconductor layer SE5 in the fifth transistor M5 is less than the channel width W12 of the second portion P2 of the channel region CH1 of the semiconductor layer SE1 in the first transistor M1. The gate electrode G5 partially overlaps with the channel region CH5. The insulation layer (analogous to the insulation layer I1 in FIG. 1C) is disposed between the gate electrode G5 and the channel region CH5.

The sixth transistor M6 comprises a semiconductor layer SE6, a gate electrode G6, and an insulation layer (analogous to the insulation layer I1 in the FIG. 1C). The semiconductor layer SE6 comprises a channel region CH6, a source region S6, and a drain region D6, wherein the channel region CH6 is connected between the source region S6 and the drain region D6, the source region S6 is directly connected to a data input end Vdata, the drain region D6 is directly connected to the source region S1 of the first transistor M1, and the channel width W6 of the channel region CH6 of the semiconductor layer SE6 in the sixth transistor M6 is less than the channel width W12 of the second portion P2 of the channel region CH1 of the semiconductor layer SE1 in the first transistor M1. The gate electrode G6 partially overlaps with the channel region CH6. The insulation layer (analogous to the insulation layer I1 in the FIG. 1C) is disposed between the gate electrode G6 and the channel region CH6.

In one or more embodiments of the present disclosure, the gate electrode G2 of the second transistor M2 and the gate electrode G5 of the fifth transistor M5 are electrically connected to a light-emitting signal (or light-emitting signal end) EM, the gate electrode G3 of the third transistor M3 and the gate electrode G6 of the sixth transistor M6 are electrically connected to a first scan signal (or first scan signal end) N1, and the gate electrode G4 of the fourth transistor M4 is electrically connected to a second scan signal (or second scan signal end) N2. In other words, the gate electrode G2 of the second transistor M2 and the gate electrode G5 of the fifth transistor M5 are receiving a light-emitting signal EM, the gate electrode G3 of the third transistor M3 and the gate electrode G6 of the sixth transistor M6 are receiving a first scan signal N1, and the gate electrode G4 of the fourth transistor M4 is receiving a second scan signal N2.

As described above, in a layer structure, the pixel circuit 100 may comprise a semiconductor layer 101 (a block filled with dots), a first insulation layer (analogous to I1 in FIG. 1C), a first conductive layer 103 (a blank block), a second insulation layer (analogous to I1 in FIG. 1C), and a second conductive layer 105 (a block filled with oblique lines), that are stacked in order. Herein, a part of the semiconductor layer 101 is covered by the second conductive layer 105, with the shape and the configuration thereof being shown by dashed lines.

The semiconductor layer 101 may be patterned, doped with ions, and subjected to other steps, to form the semiconductor layers SE1-SE6. The first insulation layer covers the semiconductor layer 101. The first conductive layer 103 is patterned to form the gate electrodes G1-G6. The first insulation layer (analogous to I1 in FIG. 1C) and the second insulation layer (analogous to I1 in FIG. 1C) may have a plurality of contact windows 104a to expose some predetermined connection areas. The second conductive layer 105 may be disposed on the second insulation layer (analogous to I1 in FIG. 1C), and in contact with the connection areas through the contact windows 104a, and then patterned to form predetermined electrical connections.

Although the channel width W13 and the channel widths W1-W6 are configured to be substantially the same in the figures, the scope of the present disclosure is not limited thereto and in practice, these channel regions may have any suitable width.

Figure 5C:
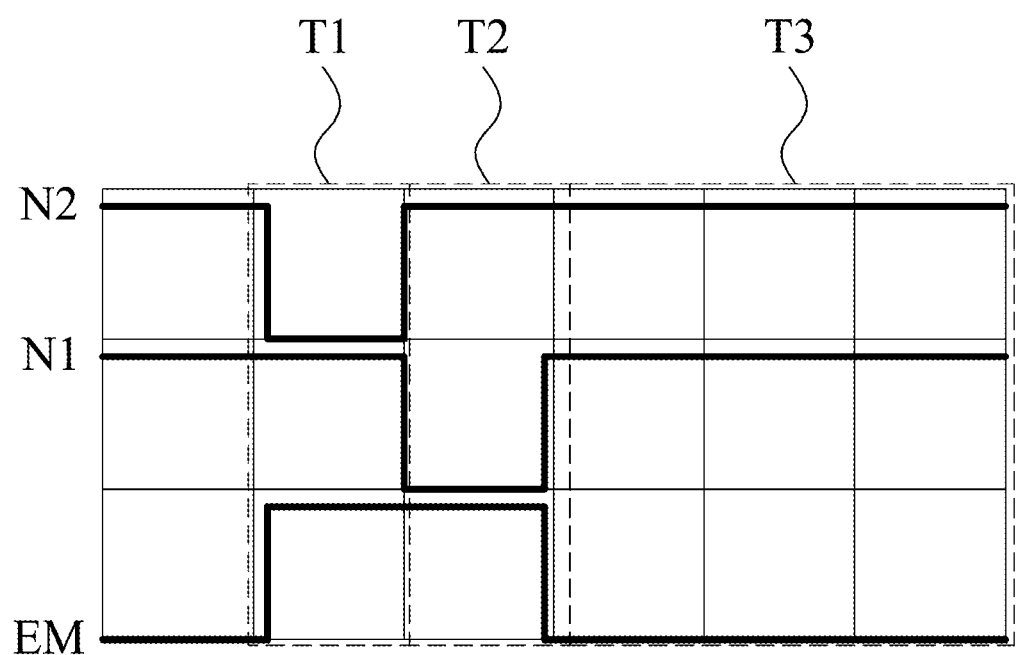
FIG. 5C is a schematic view of signals of the pixel circuit in FIG. 5A.
Figure 5D:
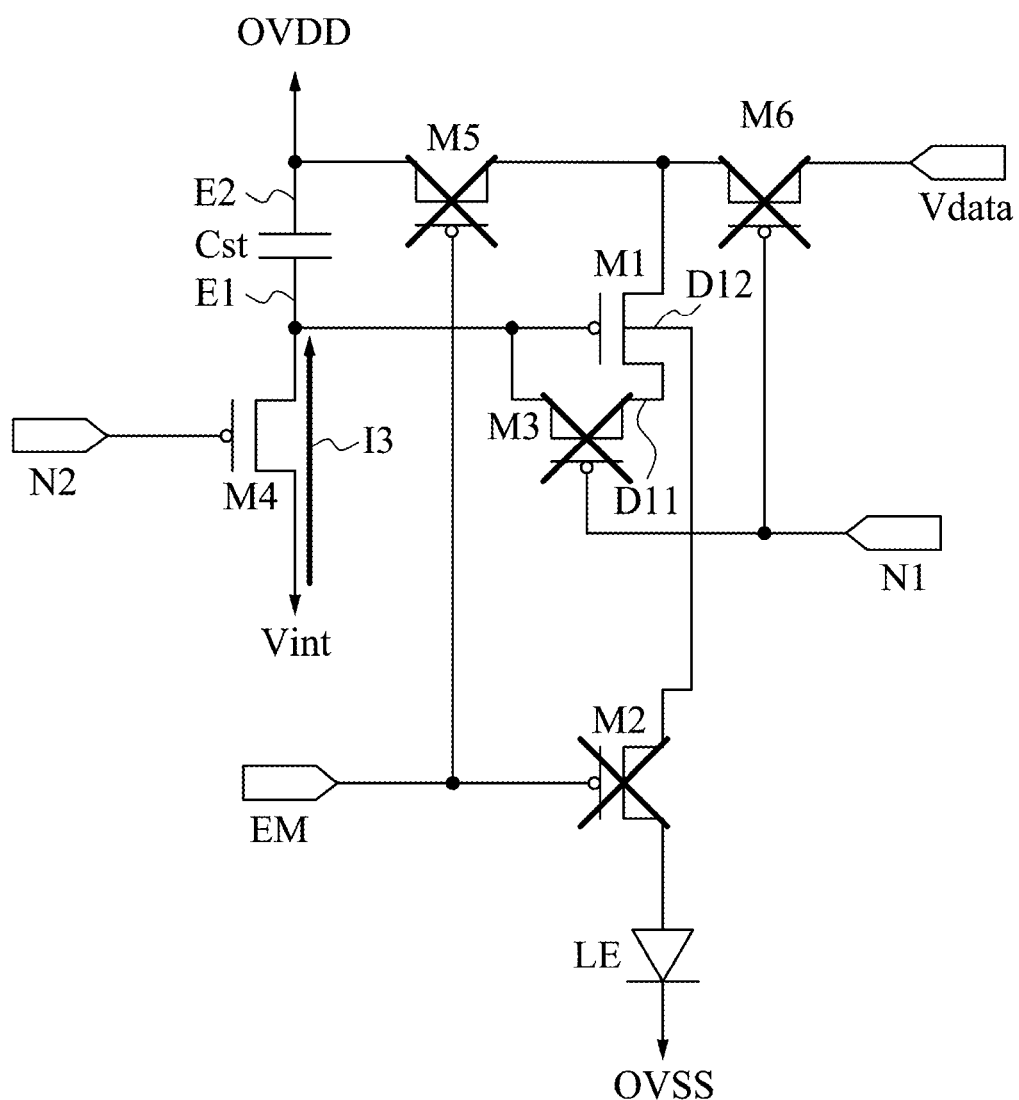
Figure 5E:
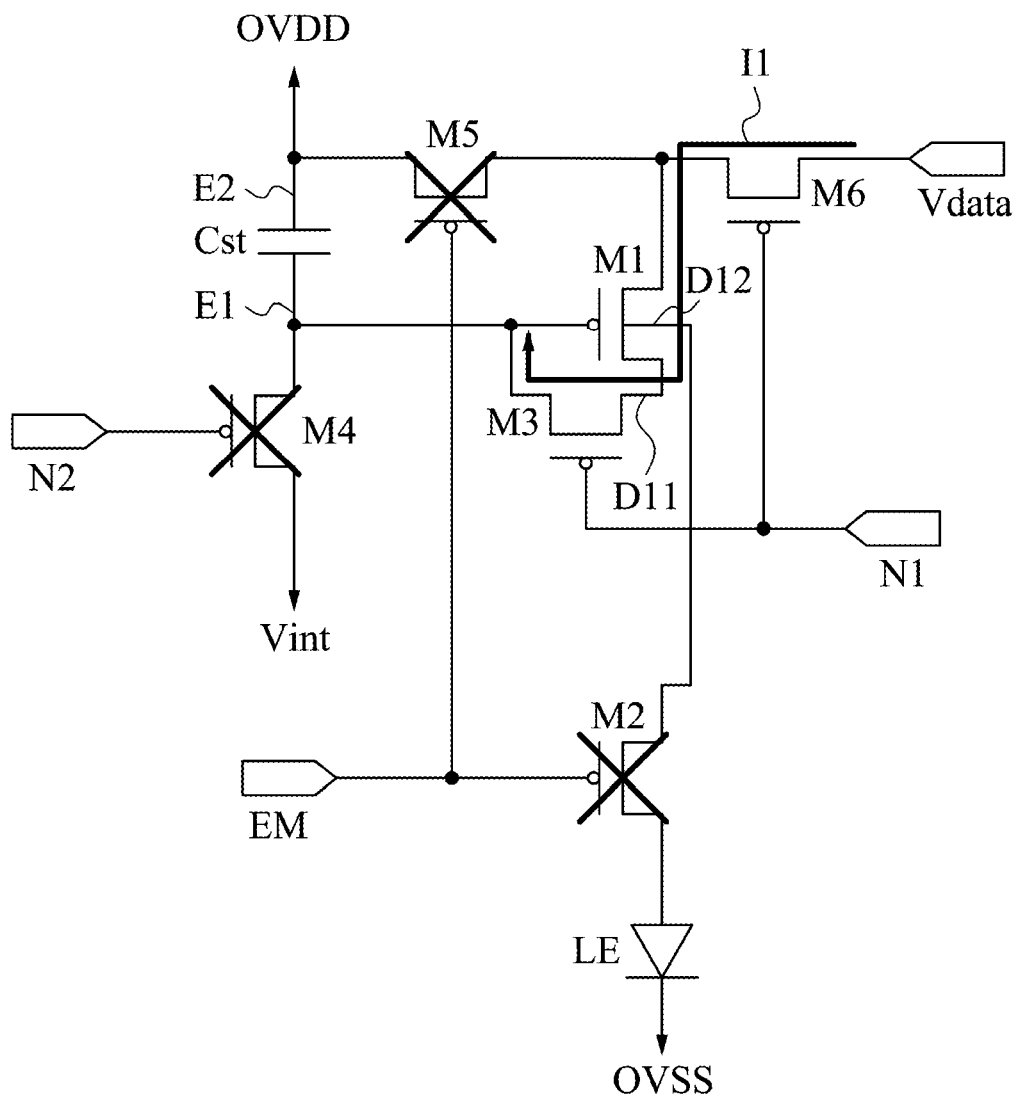
Figure 5F:
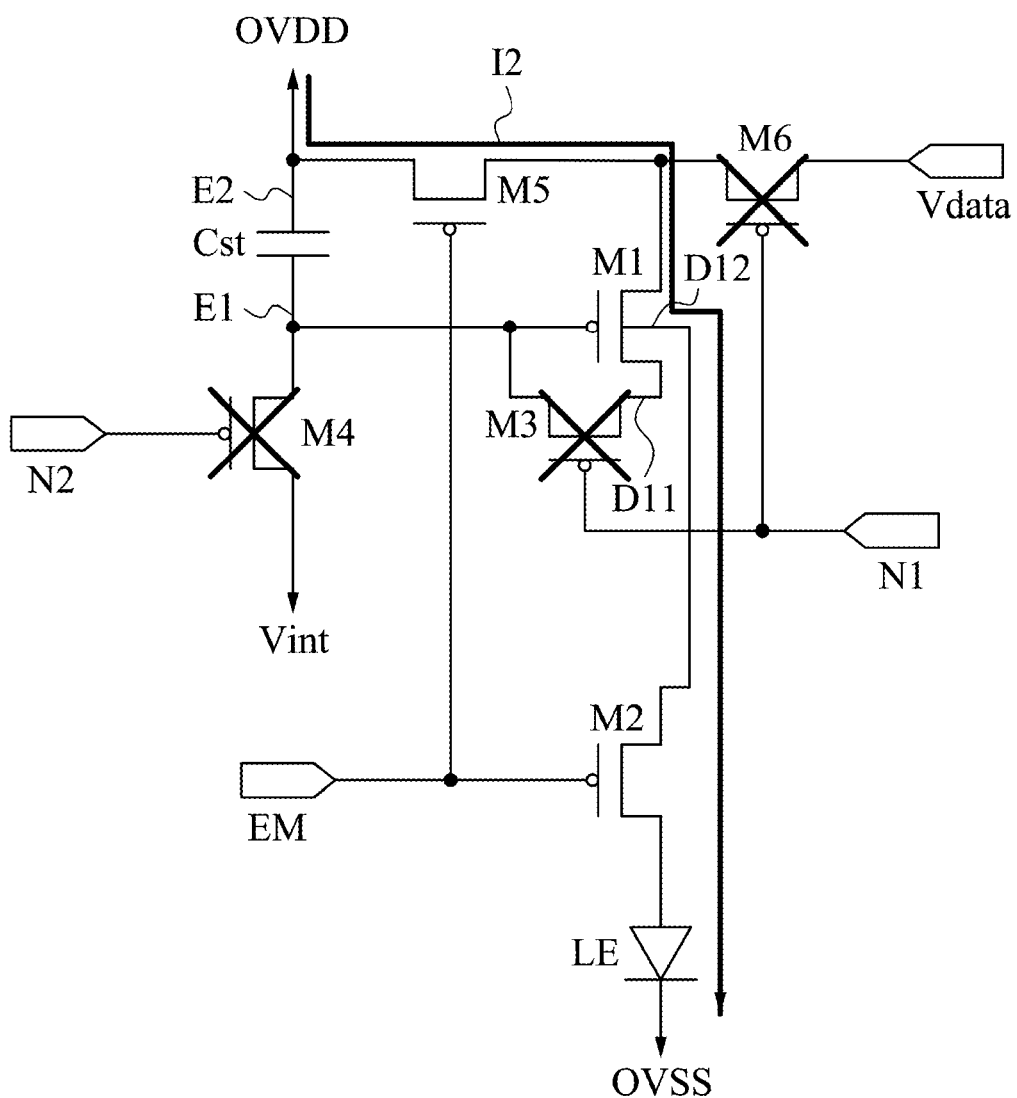

Reference is made to FIG. 5C to FIG. 5F together. FIG. 5C is a schematic view of signals of the pixel circuit 200 in FIG. 5A. FIG. 5D to FIG. 5F are schematic views of operation of the pixel circuit in FIG. 5A in various time periods. Hereafter, the pixel circuit 200 is operated in three time period stages respectively.

Reference is made to FIG. 5C and FIG. 5D together. In a first time period T1 (i.e., a reset state), the third transistor M3 and the sixth transistor M6 are turned off according to the first scan signal N1 having a high voltage level, and the second scan signal N2 is changed from having a high voltage level into having a low voltage level, such that the fourth transistor M4 is turned on, and the second transistor M2 and the fifth transistor M6 are turned off according to the light-emitting signal EM having a high voltage level. The first end E1 of the capacitive device Cst and the potential Vg of the gate electrode G1 are coupled to the initial voltage end Vint, such that the transistor M1 is turned off.

By the operations above, charges in the capacitive device Cst can be released through a current I3 via the fourth transistor M4 into the initial voltage end Vint, and the potential Vg at the gate electrode G1 of the first transistor M1 also decreases with the charge release from the capacitive device Cst, thus achieving the purpose of the reset.

Reference is made to FIG. 5C and FIG. 5E together. In the second time period T2 (i.e., a data writing state), the second transistor M2 and the fifth transistor M5 are turned off according to the light-emitting signal EM having a high voltage level. The fourth transistor M4 is turned off according to the second scan signal N2 having a high voltage level. The third transistor M3 and the sixth transistor M6 are turned on according to the first scan signal N1 having a low voltage level, such that the first drain region D11 of the first transistor M1 is electrically connected to the gate electrode G1 and the first end E1 of the capacitive device Cst. The current I1 may be provided by the data input end Vdata via the sixth transistor M6, flow from the source region S1 of the first transistor M1 through the second portion P2 of the channel region CH1 toward the first drain region D11, and then through the third transistor M3 to charge the capacitive device Cst.

As described above in the first embodiment, by designing the channel width W12 as greater than the channel width W13, the current I1 may be raised, such that the compensation capability is increased, the potential at the gate electrode G1 of the first transistor M1 can be charged to reach a potential difference of the data input end Vdata and an absolute value of the threshold voltage Vth_M1 of the first transistor M1 (e.g., Vdata−|Vth_M1|). As such, the subsequent problem of uneven brightness of the display due to under-compensation can be avoided.

Then, reference is made to FIG. 5C and FIG. 5F together. In the third time period T3 (i.e., a light-emitting state), the third transistor M3 and the sixth transistor M6 are turned off according to the first scan signal N1 having a high voltage level (e.g., positive 6V). The second transistor M2 and the fifth transistor M5 are turned on according to the light-emitting signal EM having a low voltage level, such that the light-emitting element LE is conducted with the voltage supply end OVDD via the second drain region D12 of the first transistor M1.

At this time, according to the potential Vg (e.g., substantially equal to Vdata−|Vth_M1|) of the gate electrode G1 of the first transistor M1, the first transistor M1 enables a current I2 flowing from the source region Si of the first transistor M1 through the third portion P3 of the channel region CH1 (see FIG. 5B) toward the second drain region D12 and then through the second transistor M2, to cause the light-emitting element LE to generate light rays (or namely to emit light). Herein, as described above in the first embodiment, by designing the channel width W12 as greater than the channel width W13, when the capacitor is under-compensated, the amount of shifting of the current I2 may be reduced, thereby preventing uneven brightness of a display from being worsened due to shifting of the current I2.

It is to be noted that in such an embodiment, at this time, the potential at the source region S1 of the first transistor M1 is substantially equal to OVDD, and the potential Vg at the gate electrode G1 of the first transistor M1 is substantially equal to Vdata−|Vth_M1|, so the potential difference Vsg between the source region S1 and the gate electrode G1 of the first transistor M1 is substantially equal to OVDD−Vdata−|Vth_M1|. Referring to the Equation (1), the amount of the current I2 meets: $(1/2) \times (\mu c W/L) \times (OVDD-Vdata)^2$. Accordingly, it can be known from the equation above, in the third time period T3, the amount of the current I2 only corresponds to the voltage supply end OVDD and the data input end Vdata, and is not related to the value of the threshold voltage Vth_M1 of the first transistor M1.

In this way, in the second time period T2 and the third time period T3, the potential difference between the voltage supply end OVDD and the gate electrode of the first transistor M1 can be controlled within a substantially fixed level. Thus, compared to the conventional pixel driving circuit, the pixel circuit 200 of the present disclosure has better operation stability. Other details of the present embodiment are generally as described above in the first embodiment and are not repeatedly described herein.

Figure 6A:
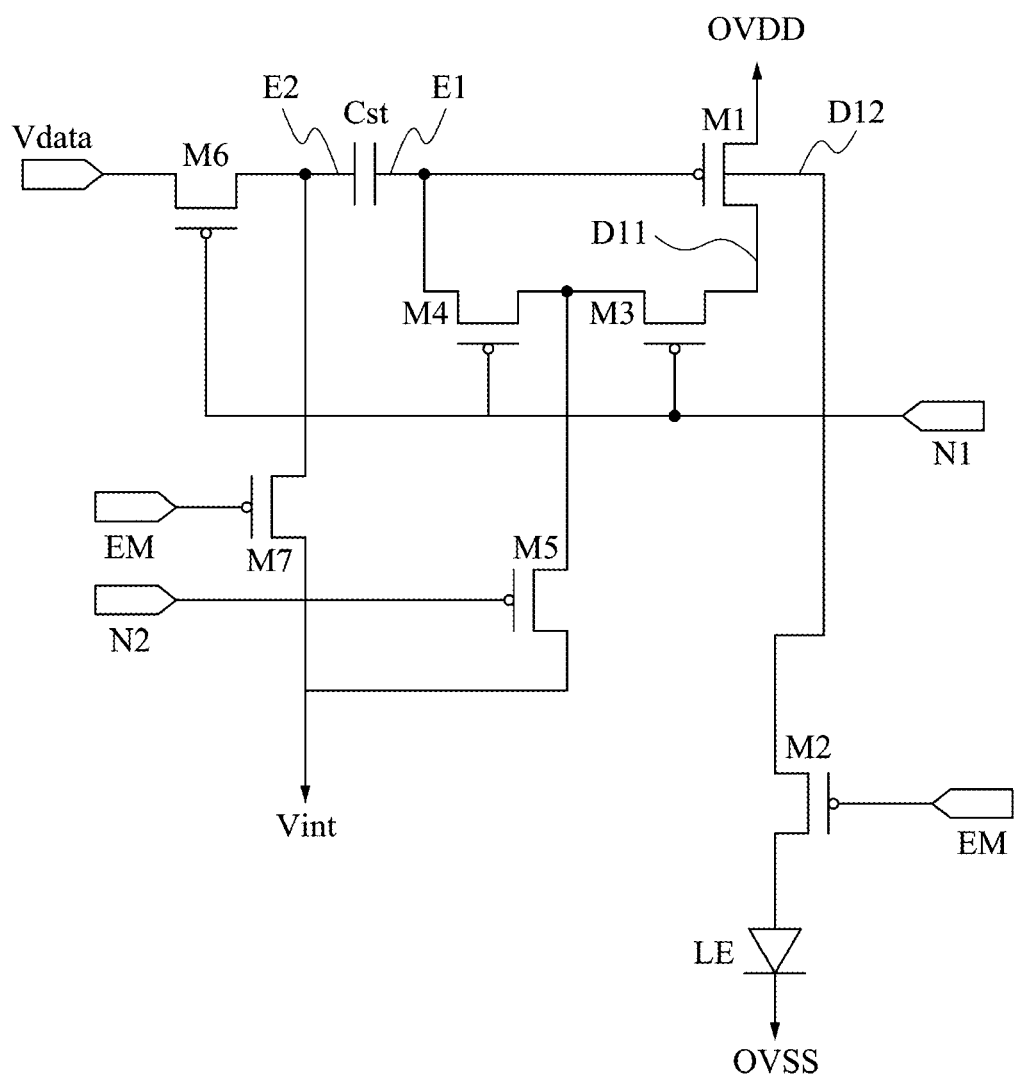
FIG. 6A is an equivalent circuit diagram of a pixel circuit according to a sixth embodiment of the present disclosure.
Figure 6B:
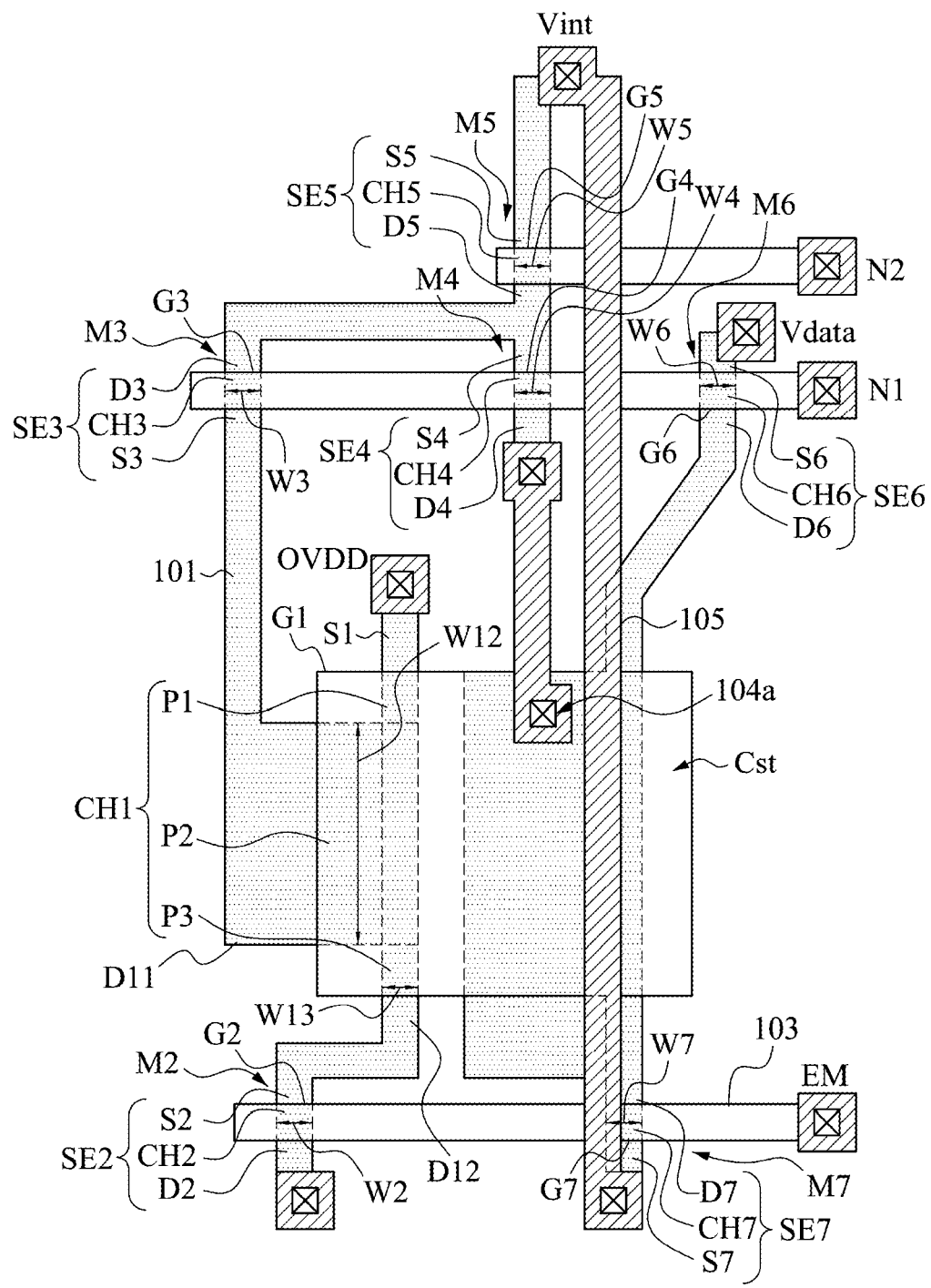
FIG. 6B is a schematic top view of the pixel circuit in FIG. 6A.
Figure 6C:
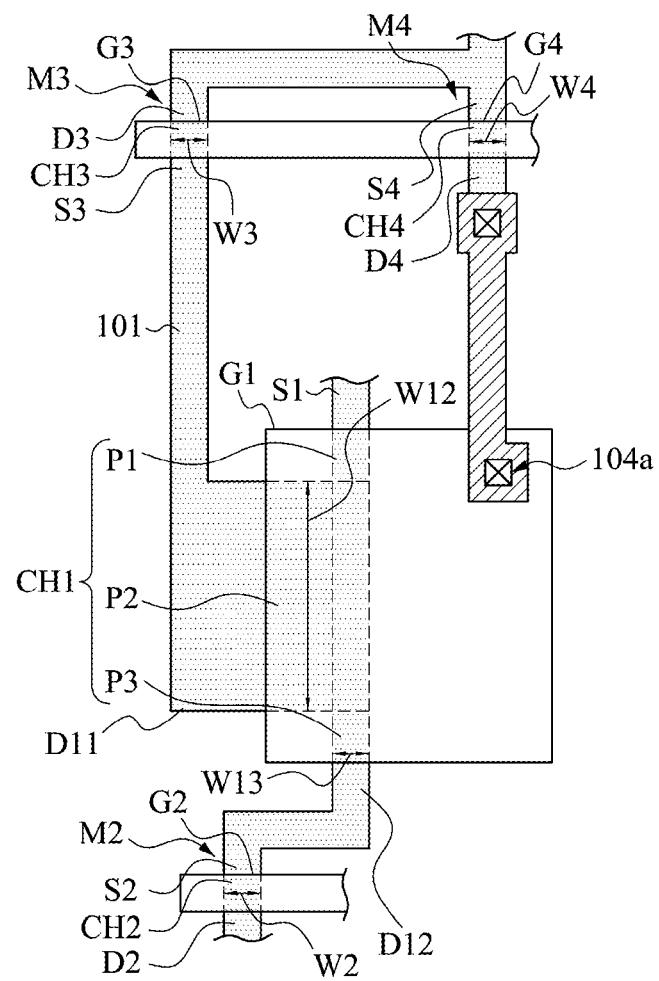
FIG. 6C is a partial schematic top view of the pixel circuit in FIG. 6B.

Reference is made to FIG. 6A to FIG. 6C together. FIG. 6B is a schematic top view of the pixel circuit 300 in FIG. 6A. FIG. 6C is a partial schematic top view of the pixel circuit 300 in FIG. 6B. The pixel circuit 300 of the present embodiment is substantially similar to the pixel circuit 300 in the first embodiment, with a difference in that the pixel circuit 300 of the present embodiment has seven transistors and one capacitive device, i.e., a 7T1C structure. Herein, the pixel circuit 300 comprises a first transistor M1, a capacitive device Cst, a light-emitting element LE, a second transistor M2, a third transistor M3, a fourth transistor M4, a fifth transistor M5, a sixth transistor M6, and a seventh transistor M7. The configurations of the first transistor M1, the capacitive device Cst, the light-emitting element LE, the second transistor M2, and the third transistor M3 are generally as described in the first embodiment, and are not repeatedly described herein.

The fourth transistor M4 comprises a semiconductor layer SE4, a gate electrode G4, and an insulation layer (analogous to the insulation layer I1 in the FIG. 1C). The semiconductor layer SE4 comprises a channel region CH4, a source region S4, and a drain region D4, wherein the channel region CH4 is connected between the source region S4 and the drain region D4, the source region S4 is directly connected to the drain region D3 of the third transistor M3, the drain region D4 is directly connected to the first end E1 of the capacitive device Cst (i.e., the gate electrode G1 of the first transistor M1), and the channel width W4 of the channel region CH4 of the semiconductor layer SE4 in the fourth transistor M4 is less than the channel width W12 of the second portion P2 of the channel region CH1 of the semiconductor layer SE1 in the first transistor M1. The gate electrode G4 partially overlaps with the channel region CH4. The insulation layer (analogous to the insulation layer I1 in the FIG. 1C) is disposed between the gate electrode G4 and the channel region CH4.

The fifth transistor M5 comprises a semiconductor layer SE5, a gate electrode G5, and an insulation layer (analogous to the insulation layer I1 in the FIG. 1C). The semiconductor layer SE5 comprises a channel region CH5, a source region S5, and a drain region D5, wherein the channel region CH5 is connected between the source region S5 and the drain region D5, the source region S5 is directly connected to an initial voltage end Vint, the drain region D5 is directly connected to the drain region D3 of the third transistor M3, and the channel width W5 of the channel region CH5 of the semiconductor layer SE5 in the fifth transistor M5 is less than the channel width W12 of the second portion P2 of the channel region CH1 of the semiconductor layer SE1 in the first transistor M1. The gate electrode G5 partially overlaps with the channel region CH5. The insulation layer (analogous to the insulation layer I1 in the FIG. 1C) is disposed between the gate electrode G5 and the channel region CH5.

The sixth transistor M6 comprises a semiconductor layer SE6, a gate electrode G6, and an insulation layer (analogous to the insulation layer I1 in the FIG. 1C). The semiconductor layer SE6 comprises a channel region CH6, a source region S6, and a drain region D6, wherein the channel region CH6 is connected between the source region S6 and the drain region D6, the source region S6 is directly connected to a data input end Vdata, the drain region D6 is directly connected to the second end E2 of the capacitive device Cst, and the channel width W6 of the channel region CH6 of the semiconductor layer SE6 in the sixth transistor M6 is less than the channel width W12 of the second portion P2 of the channel region CH1 of the semiconductor layer SE1 in the first transistor M1. The gate electrode G6 partially overlaps with the channel region CH6. The insulation layer (analogous to the insulation layer I1 in the FIG. 1C) is disposed between the gate electrode G6 and the channel region CH6.

The seventh transistor M7 comprises a semiconductor layer SE7, a gate electrode G7, and an insulation layer (analogous to the insulation layer I1 in the FIG. 1C). The semiconductor layer SE7 comprises a channel region CH7, a source region S7, and a drain region D7, wherein the channel region CH7 is connected between the source region S7 and the drain region D7, the source region S7 is directly connected to an initial voltage end Vint, the drain region D7 is directly connected to the second end E2 of the capacitive device Cst, wherein the potential source V to which the second end E2 of the capacitive device Cst is connected is the data input end Vdata or the initial voltage end Vint, and the channel width W7 of the channel region CH7 of the semiconductor layer SE7 in the seventh transistor M7 is less than the channel width W12 of the second portion P2 of the channel region CH1 of the semiconductor layer SE1 in the first transistor M1. The gate electrode G7 partially overlaps with the channel region CH7. The insulation layer (analogous to the insulation layer I1 in the FIG. 1C) is disposed between the gate electrode G7 and the channel region CH7.

In one or more embodiments of the present disclosure, the gate electrode G2 of the second transistor M2 and the gate electrode G7 of the seventh transistor M7 are electrically connected to a light-emitting signal (or light-emitting signal end) EM; the gate electrode G3 of the third transistor M3, the gate electrode G4 of the fourth transistor M4, and the gate electrode G6 of the sixth transistor M6 are electrically connected to a first scan signal (or first scan signal end) N1; the gate electrode G5 of the fifth transistor M5 is electrically connected to a second scan signal (or second scan signal end) N2. In other words, the gate electrode G2 of the second transistor M2 and the gate electrode G7 of the seventh transistor M7 are receiving a light-emitting signal EM; the gate electrode G3 of the third transistor M3, the gate electrode G4 of the fourth transistor M4, and the gate electrode G6 of the sixth transistor M6 are receiving a first scan signal N1; the gate electrode G5 of the fifth transistor M5 is receiving a second scan signal N2

As described above, in a layer structure, the pixel circuit 100 may comprise a semiconductor layer 101 (a block filled with dots), a first insulation layer (analogous to I1 in FIG. 1C), a first conductive layer 103 (a blank block), a second insulation layer (analogous to I1 in FIG. 1C), and a second conductive layer 105 (a block filled with oblique lines), that are stacked in order.

The semiconductor layer 101 may be patterned, doped with ions, and subjected to other steps, to form the semiconductor layers SE1-SE7. The first insulation layer covers the semiconductor layer 101. The first conductive layer 103 is patterned to form the gate electrodes G1-G7. The first insulation layer (analogous to I1 in FIG. 1C) and the second insulation layer (analogous to I1 in FIG. 1C) may have a plurality of contact windows 104a to expose some predetermined connection areas. The second conductive layer 105 may be disposed on the second insulation layer, and in contact with the connection areas through the contact windows 104a, and then patterned to form predetermined electrical connections.

Although the channel width W13 and the channel widths W1-W7 are configured to be substantially the same in the figures, the scope of the present disclosure is not limited thereto and in practice, these channel regions may have any suitable width.

Figure 6D:
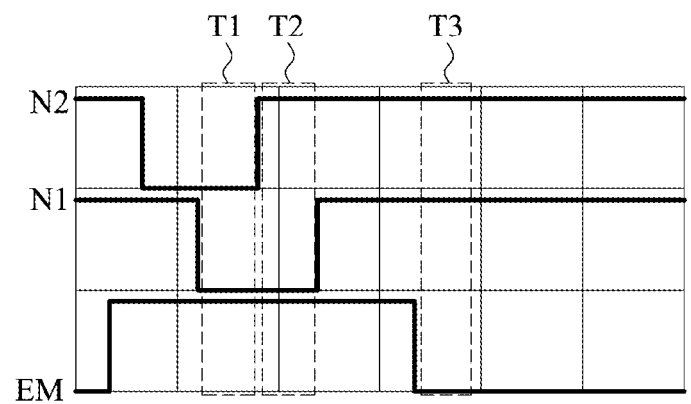
FIG. 6D is a schematic view of a signal of the pixel circuit in FIG. 6A.
Figure 6E:
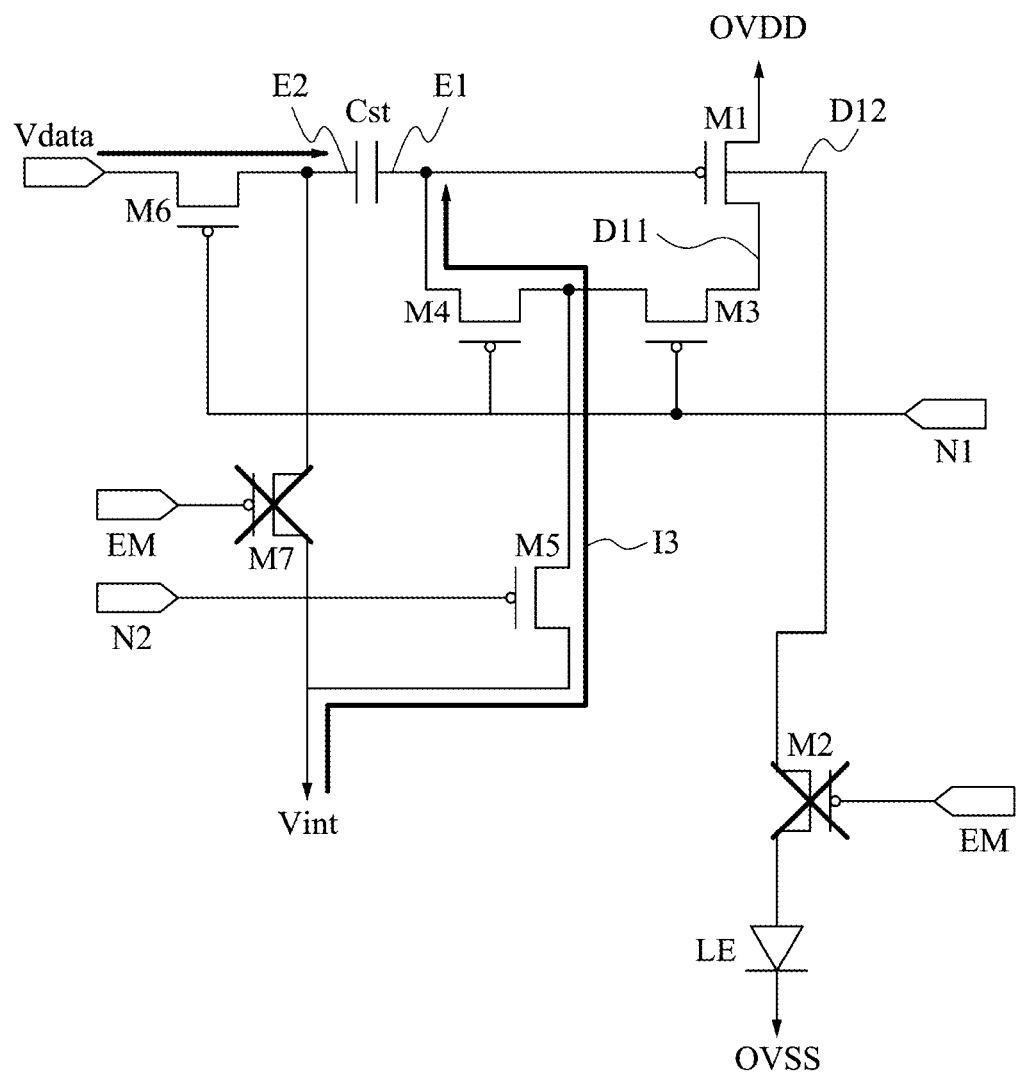
Figure 6F:
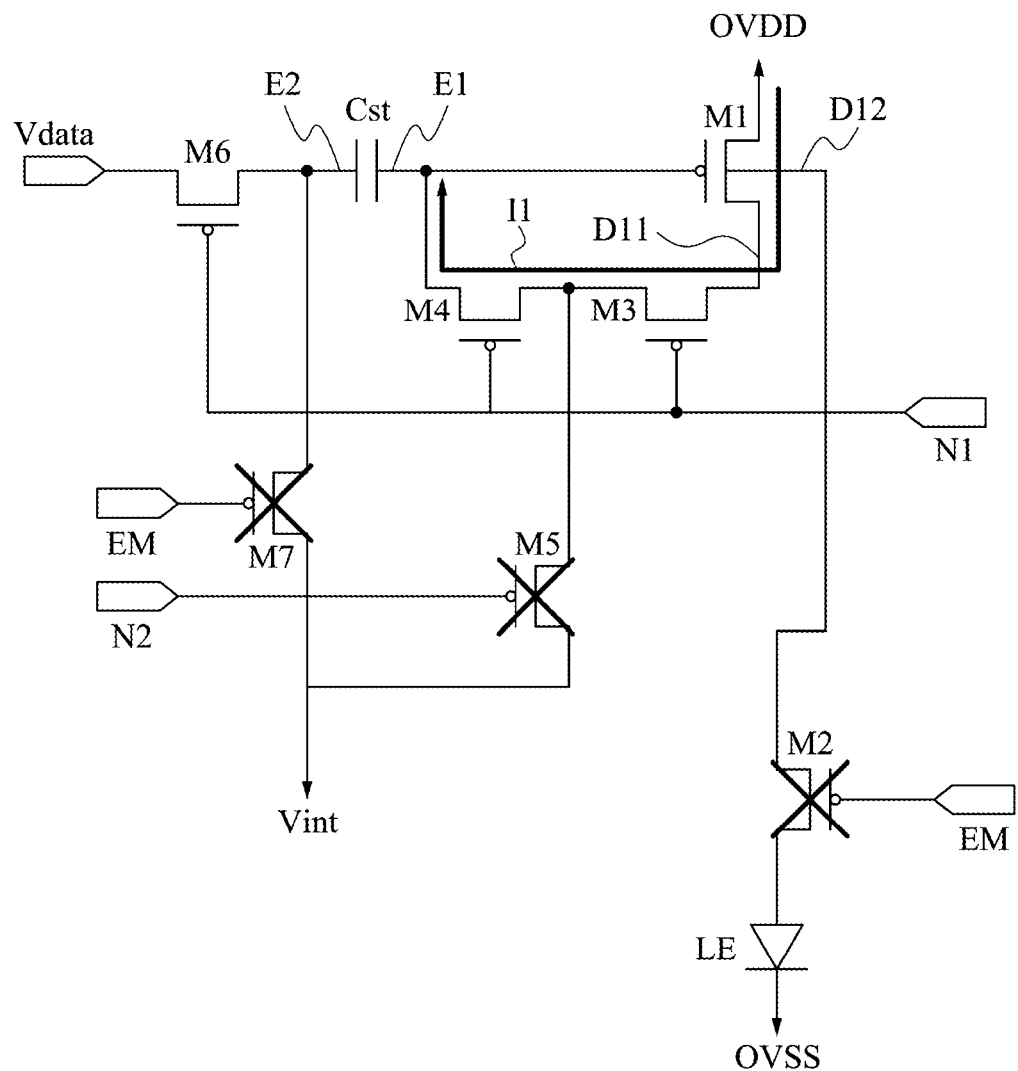
Figure 6G:
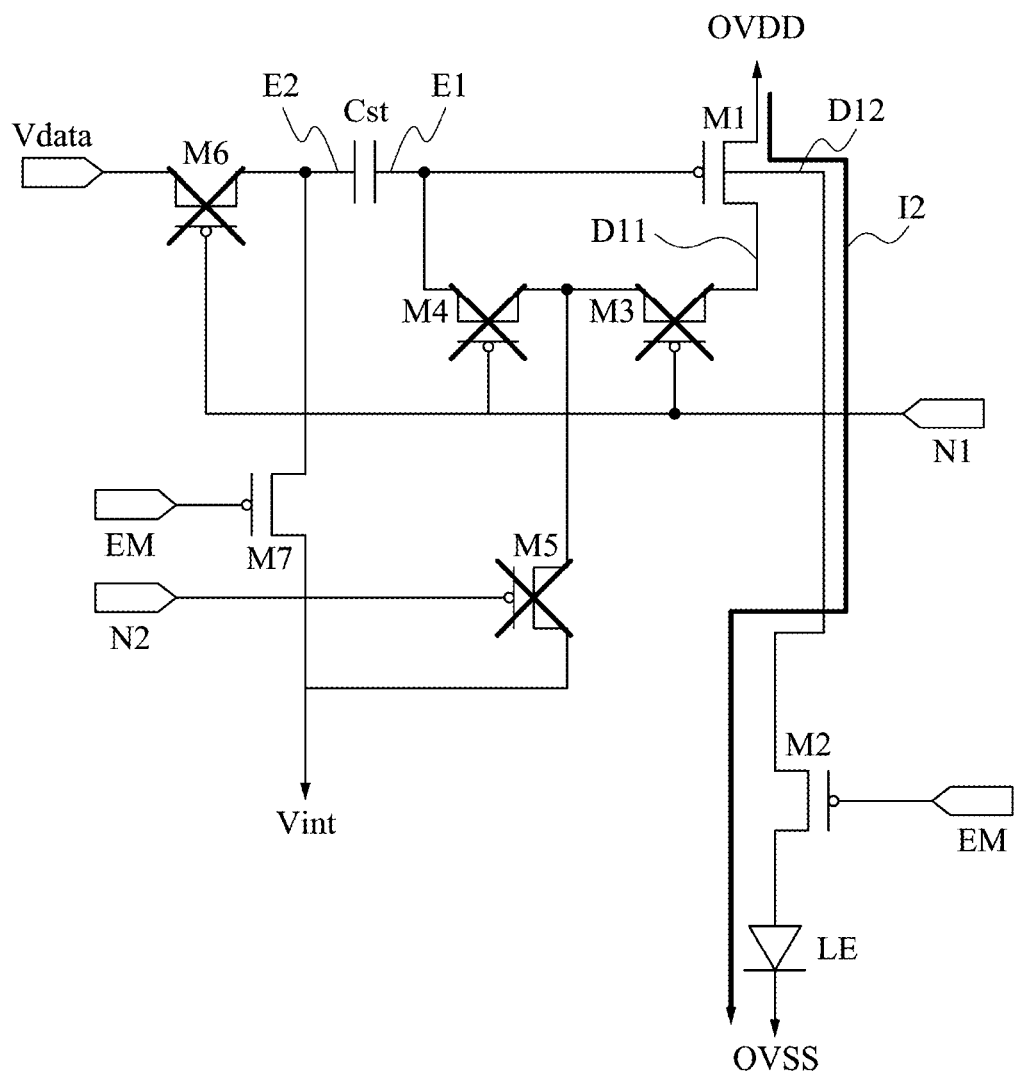

Reference is made to FIG. 6D to FIG. 6G together. FIG. 6A is an equivalent circuit diagram of a pixel circuit according to a sixth embodiment of the present disclosure. FIG. 6D is a schematic view of a signal of the pixel circuit 300 in FIG. 6A. FIG. 6E to FIG. 6G are schematic views of operation of the pixel circuit in FIG. 6A in various time periods. Hereafter, the pixel circuit 300 is operated in three time period stages respectively.

Reference is made to FIG. 6D to FIG. 6E together. In a first time period T1 (i.e., a reset state), the second transistor M2 and the seventh transistor M7 are turned off according to the light-emitting signal EM having a high voltage level, and first the second scan signal N2 is changed from having a high voltage level into having a low voltage level such that the fifth transistor M5 is turned on, and the first scan signal Ni is changed from having a high voltage level into having a low voltage level such that the third transistor M3, the fourth transistor M4, and the fifth transistor M6 are turned on. The first end E1 of the capacitive device Cst and the potential Vg of the gate electrode G1 are coupled to the initial voltage end Vint, such that the transistor M1 is turned off. Also, the potential at the second end E2 of the capacitive device Cst is coupled to the data input end Vdata.

By the operations above, charges in the capacitive device Cst can be released through a current I3 via the fourth transistor M4 into the initial voltage end Vint, and the potential Vg at the gate electrode G1 of the first transistor M1 also decreases with the charge release from the capacitive device Cst, thus achieving the purpose of the reset.

Reference is made to FIG. 6D to FIG. 6F together. In the second time period T2 (i.e., a data writing state), the second transistor M2 and the seventh transistor M7 are turned off according to the light-emitting signal EM having a high voltage level. The fifth transistor M5 is turned off according to the second scan signal N2 having a high voltage level. The third transistor M3, the fourth transistor M4, and the sixth transistor M6 are turned on according to the first scan signal N1 having a low voltage level (e.g., negative 4V), such that the first drain region D11 of the first transistor M1 is electrically connected to the gate electrode G1 and the first end E1 of the capacitive device Cst. The current I1 may be provided by the voltage supply end OVDD, flow from the source region S1 of the first transistor M1 through the second portion P2 of the channel region CH1 toward the first drain region D11 and then through the third transistor M3 and the fourth transistor M4, to charge the capacitive device Cst.

As described above in the first embodiment, herein, due to the channel width W12 being greater than the channel width W13, the current I1 has a larger value, such that the compensation capability may be increased, the potential at the gate electrode G1 of the first transistor M1 can be quickly charged to fully reach a potential difference of the voltage supply end OVDD and an absolute value of the threshold voltage Vth_M1 of the first transistor M1 (e.g., OVDD−|Vth_M1|). As such, the subsequent problem of uneven brightness of the display due to under-compensation can be avoided.

Reference is made to FIG. 6D to FIG. 6G together. Then, in the third time period T3 (i.e., a light-emitting state), the second transistor M2 and the seventh transistor M7 are turned on according to the light-emitting signal EM having a low voltage level. The fifth transistor M5 is turned off according to the second scan signal N2 having a high voltage level. The third transistor M3, the fourth transistor M4, the fifth transistor M5, and the sixth transistor M6 are turned off according to the first scan signal Ni having a high voltage level (e.g., positive 6V). Since the second transistor M2 is turned on, a current may flow toward the light-emitting element LE via the second drain region D12 of the first transistor M1.

At this time, according to the potential Vg (e.g., substantially equal to Vdata−|Vth_M1|) of the gate electrode G1 of the first transistor M1, the first transistor M1 enables a current I2 flowing from the source region Si of the first transistor M1 through the third portion P3 of the channel region CH1 (see FIG. 6B) toward the second drain region D12 and then through the second transistor M2, to cause the light-emitting element LE to generate light rays (or to emit light). Herein, as described above in the first embodiment, by designing the channel width W12 as greater than the channel width W13, when the capacitor is under-compensated, the amount of shifting of the current I2 may be reduced, thereby preventing uneven brightness of a display from being worsened due to shifting of the current I2.

It is to be noted that in such an embodiment, at this time, the potential at the source region S1 of the first transistor M1 is substantially equal to OVDD, and the potential Vg of the gate electrode G1 of the first transistor M1 is substantially equal to OVDD−|Vth_M1|+Vint−Vdata, so the potential difference Vsg between the source region S1 and the gate electrode G1 of the first transistor M1 is substantially equal to Vdata+|Vth_M1|−Vint. Referring to the Equation (1), the amount of the current I2 meets: $(1/2) \times K \times (Vdata - Vint)^2$. Accordingly, in the third time period T3, the amount of the current I2 only corresponds to the initial voltage end Vint and the data input end Vdata, and is not related to the value of the threshold voltage Vth_M1 of the first transistor M1.

In this way, in the second time period T2 and the third time period T3, the potential difference between the voltage supply end OVDD and the gate electrode of the first transistor M1 can be controlled within a substantially fixed level. Thus, compared to the conventional pixel driving circuit, the pixel circuit 300 of the present disclosure has better operation stability.

In a plurality of embodiments of the present disclosure, by designing a feedback circuit to eliminate the effect of a threshold voltage on a current, and designing a single transistor (e.g. a first transistor M1) to have a channel region CHI with two different channel widths. A feedback current passes through one of the channel regions of the transistor that has the wider width, so as to increase the feedback current to facilitate quick charging, thereby overcoming the problems for the feedback circuit which are derived from an unsaturated capacitor. Additionally, a driving current is designed to pass through one of the channel regions of the transistor that has the narrower width, thereby preventing uneven brightness of a display from being worsened due to shifting of a current.

Even though the present disclosure has been disclosed as the various above-mentioned embodiments, it is not limited thereto. Any person of ordinary skill in the art may make various changes and adjustments without departing from the spirit and scope of the present disclosure. Therefore, the scope of the present disclosure is defined in view of the appended claims.

What is claimed is:

1. A pixel circuit, comprising:
   a first transistor, comprising:
      a first semiconductor layer comprising a first channel region, a first source region, a first drain region, and a second drain region, wherein a first portion of the first channel region is connected to the first source region, a second portion of the first channel region is connected to the first drain region, and a third portion of the first channel region is connected to the second drain region, a channel width of the second portion of the first channel region is greater than a channel width of the third portion, and the first source region is electrically connected to a voltage supply end;
      a first gate electrode partially overlapping with the first channel region; and
      a first insulation layer disposed between the first gate electrode and the first channel region;
   a capacitive device having a first end electrically connected to the first gate electrode of the first transistor, and a second end electrically connected to a potential source;
   a light-emitting element;
   a second transistor, comprising:
      a second semiconductor layer comprising a second channel region, a second source region, and a third drain region, wherein the second channel region is connected between the second source region and the third drain region, the second source region is directly connected to the second drain region of the first transistor, the third drain region is electrically connected to the light-emitting element, and a channel width of the second channel region of the second semiconductor layer in the second transistor is less than a channel width of the second portion of the first channel region of the first semiconductor layer in the first transistor;
      a second gate electrode partially overlapping with the second channel region; and
      a second insulation layer disposed between the second gate electrode and the second channel region; and
   a third transistor, comprising:
      a third semiconductor layer comprising a third channel region, a third source region, and a fourth drain region, wherein the third channel region is connected between the third source region and the fourth drain region, the third source region is directly connected to the first drain region of the first transistor, the fourth drain region is electrically connected to the first end of the capacitive device, and a channel width of the third channel region of the third semiconductor layer in the third transistor is less than the channel width of the second portion of the first channel region of the first semiconductor layer in the first transistor;
      a third gate electrode partially overlapping with the third channel region; and
      a third insulation layer disposed between the third gate electrode and the third channel region.

2. The pixel circuit of claim 1, wherein the direction of the channel width of the second portion intersects a flow direction of a current passing through the second portion, and a direction of the channel width of the third portion intersects a flow direction of a current passing through the third portion.

3. The pixel circuit of claim 1, wherein a flow direction of a current passing through the second portion intersects a flow direction of a current passing through the third portion.

4. The pixel circuit of claim 1, wherein the channel width of the second portion is four times the channel width of the third portion.

5. The pixel circuit of claim 1, wherein the second gate electrode is electrically connected to a light-emitting signal, and the third gate electrode is electrically connected to a first scan signal.

6. The pixel circuit of claim 1, further comprising:
   a fourth transistor, comprising:
      a fourth semiconductor layer comprising a fourth channel region, a fourth source region, and a fifth drain region, wherein the fourth channel region is connected between the fourth source region and the fifth drain region, the fourth source region is directly connected to an initial voltage end, the fifth drain region is directly connected to the first end of the capacitive device, and a channel width of the fourth channel region of the fourth semiconductor layer in the fourth transistor is less than the channel width of the second portion of the first channel region of the first semiconductor layer in the first transistor;
      a fourth gate electrode partially overlapping with the fourth channel region; and
      a fourth insulation layer disposed between the fourth gate electrode and the fourth channel region;
   a fifth transistor, comprising:
      a fifth semiconductor layer comprising a fifth channel region, a fifth source region, and a sixth drain region, wherein the fifth channel region is connected between the fifth source region and the sixth drain region, the fifth source region is directly connected to the voltage supply end, the sixth drain region is directly connected to the first source region of the first transistor, wherein a potential source to which the second end of the capacitive device is electrically connected is the voltage supply end, and a channel width of the fifth channel region of the fifth semiconductor layer in the fifth transistor is less than the channel width of the second portion of the first channel region of the first semiconductor layer in the first transistor;

a fifth gate electrode partially overlapping with the fifth channel region; and
a fifth insulation layer disposed between the fifth gate electrode and the fifth channel region; and
a sixth transistor, comprising:
a sixth semiconductor layer comprising a sixth channel region, a sixth source region, and a seventh drain region, wherein the sixth channel region is connected between the sixth source region and the seventh drain region, the sixth source region is directly connected to a data input end, the seventh drain region is directly connected to the first source region of the first transistor, and a channel width of the sixth channel region of the sixth semiconductor layer in the sixth transistor is less than the channel width of the second portion of the first channel region of the first semiconductor layer in the first transistor;
a sixth gate electrode partially overlapping with the sixth channel region; and
a sixth insulation layer disposed between the sixth gate electrode and the sixth channel region.

7. The pixel circuit of claim 6, wherein the second gate electrode of the second transistor and the fifth gate electrode of the fifth transistor are electrically connected to a light-emitting signal, the third gate electrode of the third transistor and the sixth gate electrode of the sixth transistor are electrically connected to a first scan signal, and the fourth gate electrode of the fourth transistor is electrically connected to a second scan signal.

8. The pixel circuit of claim 6, a direction of the channel width of the fourth channel region is substantially paralleled with one of a direction of the channel width of the second portion and a direction of the channel width of the third portion.

9. The pixel circuit of claim 1, further comprising:
a fourth transistor, comprising:
a fourth semiconductor layer comprising a fourth channel region, a fourth source region, and a fifth drain region, wherein the fourth channel region is connected between the fourth source region and the fifth drain region, the fourth source region is directly connected to the fourth drain region of the third transistor, the fifth drain region is directly connected to the first end of the capacitive device, and a channel width of the fourth channel region of the fourth semiconductor layer in the fourth transistor is less than the channel width of the second portion of the first channel region of the first semiconductor layer in the first transistor;
a fourth gate electrode partially overlapping with the fourth channel region; and
a fourth insulation layer disposed between the fourth gate electrode and the fourth channel region.

10. The pixel circuit of claim 9, further comprising:
a fifth transistor, comprising:
a fifth semiconductor layer comprising a fifth channel region, a fifth source region, and a sixth drain region, wherein the fifth channel region is connected between the fifth source region and the sixth drain region, the fifth source region is directly connected to an initial voltage end, the sixth drain region is directly connected to the fourth drain region of the third transistor, and a channel width of the fifth channel region of the fifth semiconductor layer in the fifth transistor is less than the channel width of the second portion of the first channel region of the first semiconductor layer in the first transistor;
a fifth gate electrode partially overlapping with the fifth channel region; and
a fifth insulation layer disposed between the fifth gate electrode and the fifth channel region;
a sixth transistor, comprising:
a sixth semiconductor layer comprising a sixth channel region, a sixth source region, and a seventh drain region, wherein the sixth channel region is connected between the sixth source region and the seventh drain region, the sixth source region is directly connected to an data input end, the seventh drain region is directly connected to the second end of the capacitive device, and a channel width of the sixth channel region of the sixth semiconductor layer in the sixth transistor is less than the channel width of the second portion of the first channel region of the first semiconductor layer in the first transistor;
a sixth gate electrode partially overlapping with the sixth channel region; and
a sixth insulation layer disposed between the sixth gate electrode and the sixth channel region; and
a seventh transistor, comprising:
a seventh semiconductor layer comprising a seventh channel region, a seventh source region, and an eighth drain region, wherein the seventh channel region is connected between the seventh source region and the eighth drain region, the seventh source region is directly connected to the initial voltage end, the eighth drain region is directly connected to the second end of the capacitive device, wherein a potential source to which the second end of the capacitive device is electrically connected is the data input end or the initial voltage end, and a channel width of the seventh channel region of the seventh semiconductor layer in the seventh transistor is less than the channel width of the second portion of the first channel region of the first semiconductor layer in the first transistor;
a seventh gate electrode partially overlapping with the seventh channel region; and
a seventh insulation layer disposed between the seventh gate electrode and the seventh channel region.

11. The pixel circuit of claim 10, wherein the second gate electrode of the second transistor and the seventh gate electrode of the seventh transistor are electrically connected to a light-emitting signal, the third gate electrode of the third transistor, the fourth gate electrode of the fourth transistor, and the sixth gate electrode of the sixth transistor are electrically connected to a first scan signal, and the fifth gate electrode of the fifth transistor is electrically connected to a second scan signal.

12. The pixel circuit of claim 9, a direction of the channel width of the fourth channel region is substantially paralleled with one of a direction of the channel width of the second portion and a direction of the channel width of the third portion.

13. The pixel circuit of claim 1, wherein
in a first time period, a current flows from the first source region of the first transistor through the second portion of the first channel region toward the first drain region and then through the third transistor to charge the capacitive device,
in a second time period, the current flows from the first source region of the first transistor through the third portion of the first channel region toward the second drain region and then through the second transistor to cause the light-emitting element to generate light rays.

14. The pixel circuit of claim 1, wherein a current passing through the third transistor is greater than a current passing through the second transistor.

15. The pixel circuit of claim 1, wherein a direction of the channel width of the second portion intersects a direction of the channel width of the third portion.

16. The pixel circuit of claim 1, a direction of the channel width of the second channel region is substantially paralleled with one of a direction of the channel width of the second portion and a direction of the channel width of the third portion.

17. The pixel circuit of claim 1, a direction of the channel width of the third channel region is substantially paralleled with one of a direction of the channel width of the second portion and a direction of the channel width of the third portion.

* * * * *